US009941295B2

(12) United States Patent
Rabkin et al.

(10) Patent No.: US 9,941,295 B2
(45) Date of Patent: Apr. 10, 2018

(54) METHOD OF MAKING A THREE-DIMENSIONAL MEMORY DEVICE HAVING A HETEROSTRUCTURE QUANTUM WELL CHANNEL

(71) Applicant: SANDISK TECHNOLOGIES INC., Plano, TX (US)

(72) Inventors: Peter Rabkin, Cupertino, CA (US); Jayavel Pachamuthu, San Jose, CA (US); Johann Alsmeier, San Jose, CA (US); Masaaki Higashitani, Cupertino, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/733,335

(22) Filed: Jun. 8, 2015

(65) Prior Publication Data

US 2016/0358933 A1 Dec. 8, 2016

(51) Int. Cl.
*H01L 21/336* (2006.01)
*H01L 27/11582* (2017.01)
(Continued)

(52) U.S. Cl.
CPC .... *H01L 27/11582* (2013.01); *H01L 21/0214* (2013.01); *H01L 21/0217* (2013.01);
(Continued)

(58) Field of Classification Search
CPC ................................................ H01L 27/11582
(Continued)

(56) References Cited

U.S. PATENT DOCUMENTS 4,711,858 A 12/1987 Harder et al.
5,141,893 A 8/1992 Ito et al.
(Continued)

FOREIGN PATENT DOCUMENTS

JP 2010-509177 3/2010
KR 20140039721 A 4/2014

OTHER PUBLICATIONS

Notice of Allowance for U.S. Appl. No. 14/733,244, dated Apr. 27, 2016, 10 pages.
(Continued)

*Primary Examiner* — Hsin-Yi Hsieh
(74) *Attorney, Agent, or Firm* — The Marbury Law Group PLLC

(57) ABSTRACT

A cylindrical confinement electron gas confined within a two-dimensional cylindrical region can be formed in a vertical semiconductor channel extending through a plurality of electrically conductive layers comprising control gate electrodes. A memory film in a memory opening is interposed between the vertical semiconductor channel and the electrically conductive layers. The vertical semiconductor channel includes a wider band gap semiconductor material and a narrow band gap semiconductor material. The cylindrical confinement electron gas is formed at an interface between the wider band gap semiconductor material and the narrow band gap semiconductor material. As a two-dimensional electron gas, the cylindrical confinement electron gas can provide high charge carrier mobility for the vertical semiconductor channel, which can be advantageously employed to provide higher performance for a three-dimensional memory device.

17 Claims, 19 Drawing Sheets

(51) Int. Cl.
*H01L 21/28* (2006.01)
*H01L 29/778* (2006.01)
*H01L 29/792* (2006.01)
*H01L 21/02* (2006.01)
*H01L 29/06* (2006.01)

(52) U.S. Cl.
CPC .. *H01L 21/02181* (2013.01); *H01L 21/02189* (2013.01); *H01L 21/02192* (2013.01); *H01L 21/28282* (2013.01); *H01L 29/7788* (2013.01); *H01L 29/7789* (2013.01); *H01L 29/7926* (2013.01); *H01L 21/0262* (2013.01); *H01L 21/02546* (2013.01); *H01L 21/02584* (2013.01); *H01L 29/0649* (2013.01); *H01L 29/0657* (2013.01)

(58) Field of Classification Search
USPC .......................................................... 438/269
See application file for complete search history.

(56) References Cited

U.S. PATENT DOCUMENTS

| | | | |
|---|---|---|---|
| 5,212,113 | A | 5/1993 | Azoulay et al. |
| 5,244,834 | A | 9/1993 | Suzuki et al. |
| 5,346,848 | A | 9/1994 | Grupen-Shemansky et al. |
| 5,402,748 | A | 4/1995 | Takai et al. |
| 5,456,206 | A | 10/1995 | Lee et al. |
| 5,993,542 | A | 11/1999 | Yanashima et al. |
| 6,498,048 | B2 | 12/2002 | Morita |
| 6,508,879 | B1 | 1/2003 | Hashimoto |
| 6,727,523 | B2 | 4/2004 | Morita |
| 7,078,318 | B2 | 7/2006 | Jurgensen et al. |
| 7,928,427 | B1 | 4/2011 | Chang |
| 7,955,437 | B2 | 6/2011 | Shibata et al. |
| 8,603,898 | B2 | 12/2013 | Bao et al. |
| 2008/0113496 | A1 | 5/2008 | Keller et al. |
| 2008/0179659 | A1 | 7/2008 | Enda et al. |
| 2011/0233646 | A1 | 9/2011 | Mizushima et al. |
| 2012/0049267 | A1 | 3/2012 | Jung |
| 2013/0100722 | A1 | 4/2013 | Shin |
| 2014/0073099 | A1* | 3/2014 | Park ................ H01L 29/42332 438/268 |
| 2014/0284695 | A1* | 9/2014 | Won ................. H01L 29/7926 257/324 |

OTHER PUBLICATIONS

U.S. Appl. No. 14/733,244, filed Jun. 8, 2015, SanDisk Technologies Inc.
The International Searching Report and Written Opinion of the International Searching Authority for International Application No. PCT/US2016/036083, dated Nov. 15, 2016, 6 pages.
The International Searching Authority, Invitation to Pay Additional Fees for International Application No. PCT/US2016/036083, dated Sep. 20, 2016, 6 pages.
International Preliminary Report on Patentability and Written Opinion of the International Searching Authority for International Patent Application No. PCT/US2016/036083, dated Dec. 21, 2017, 12 pages.

* cited by examiner

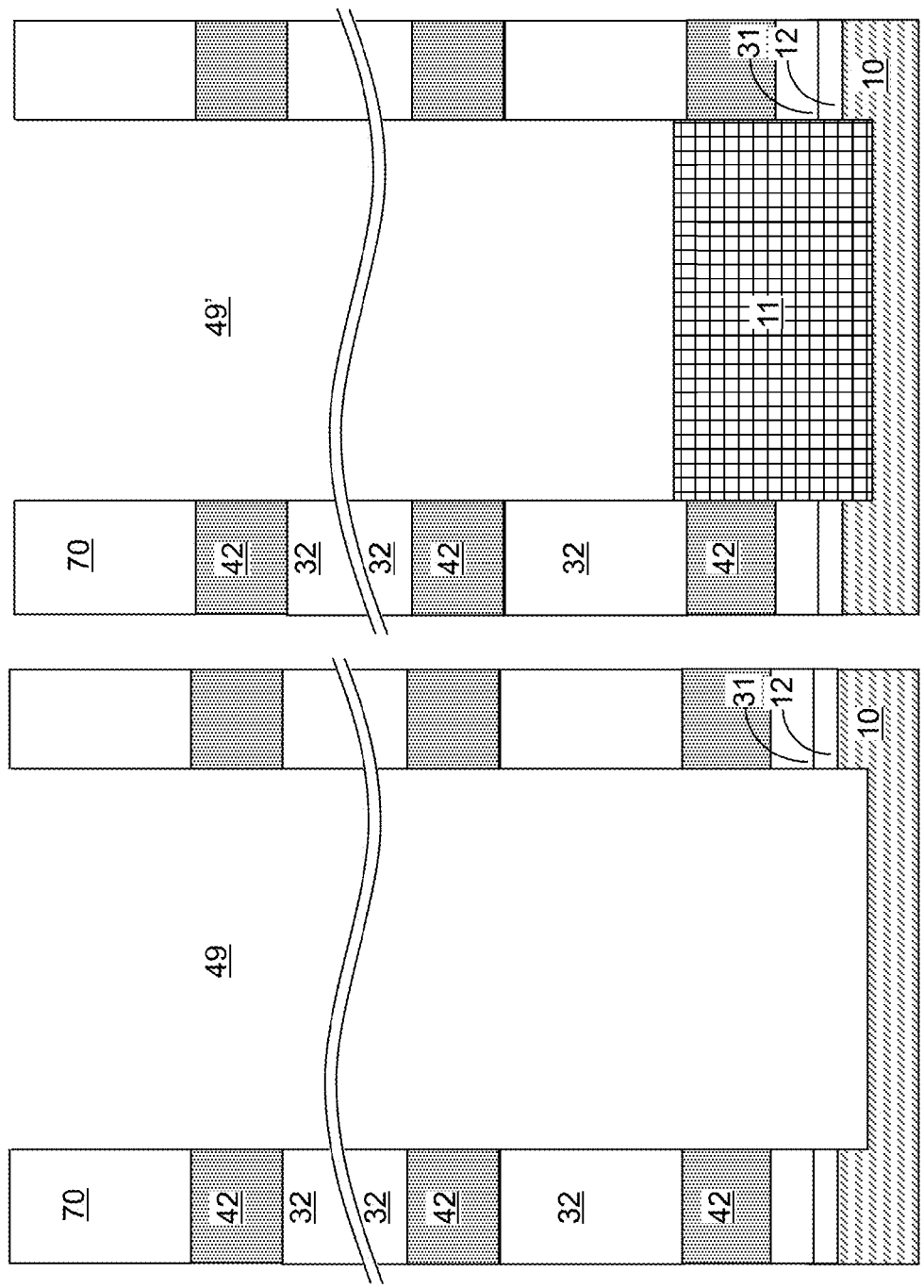

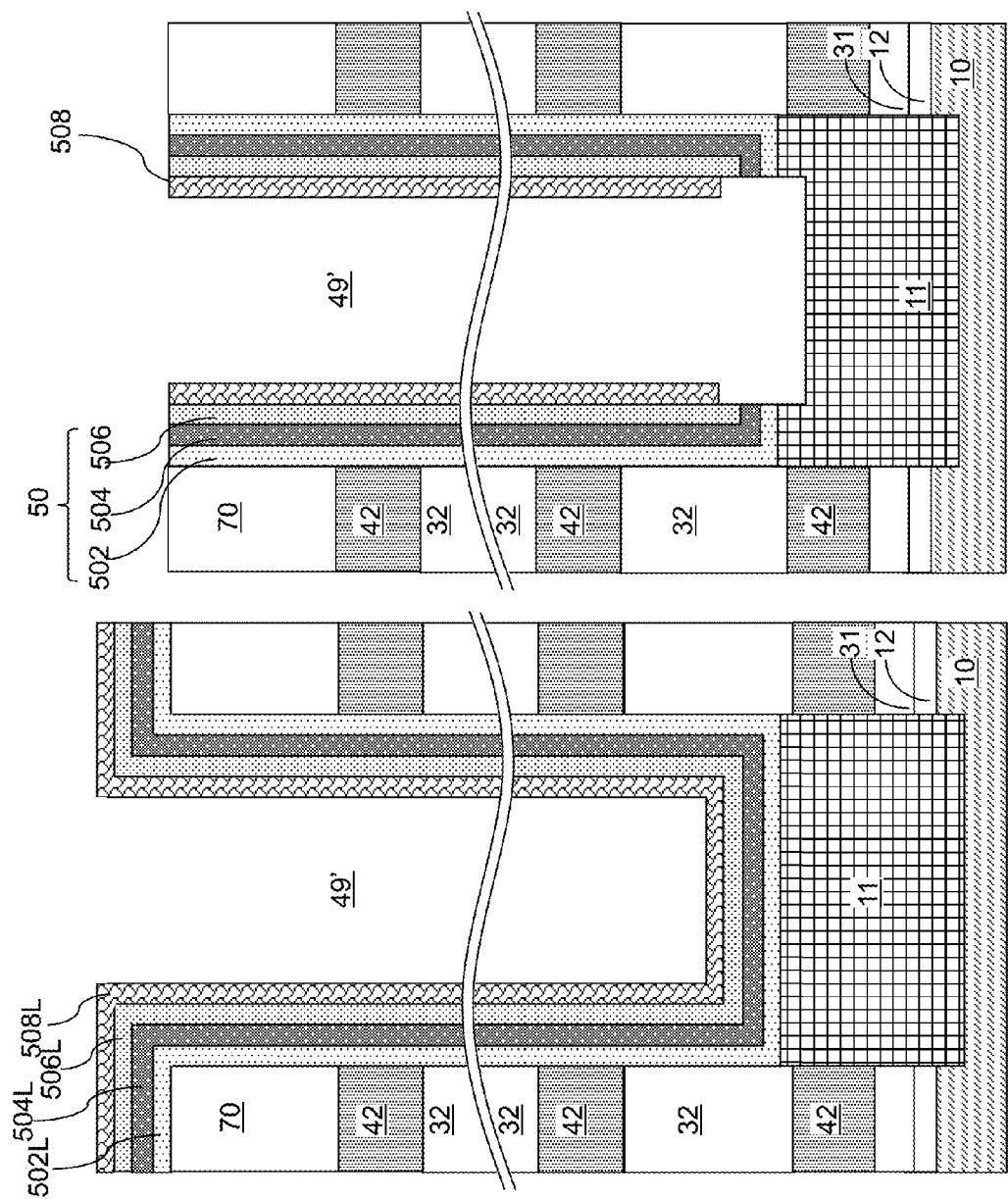

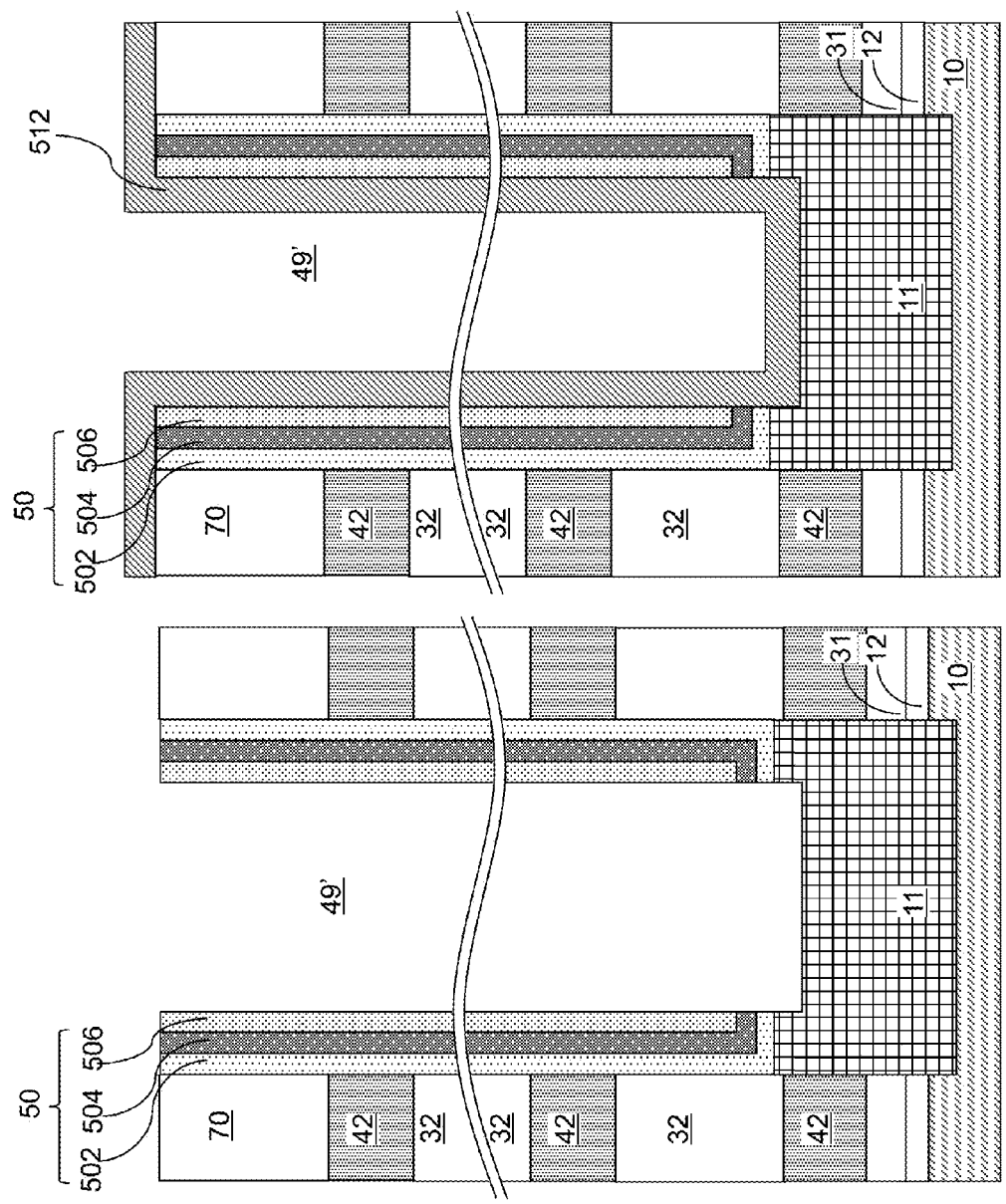

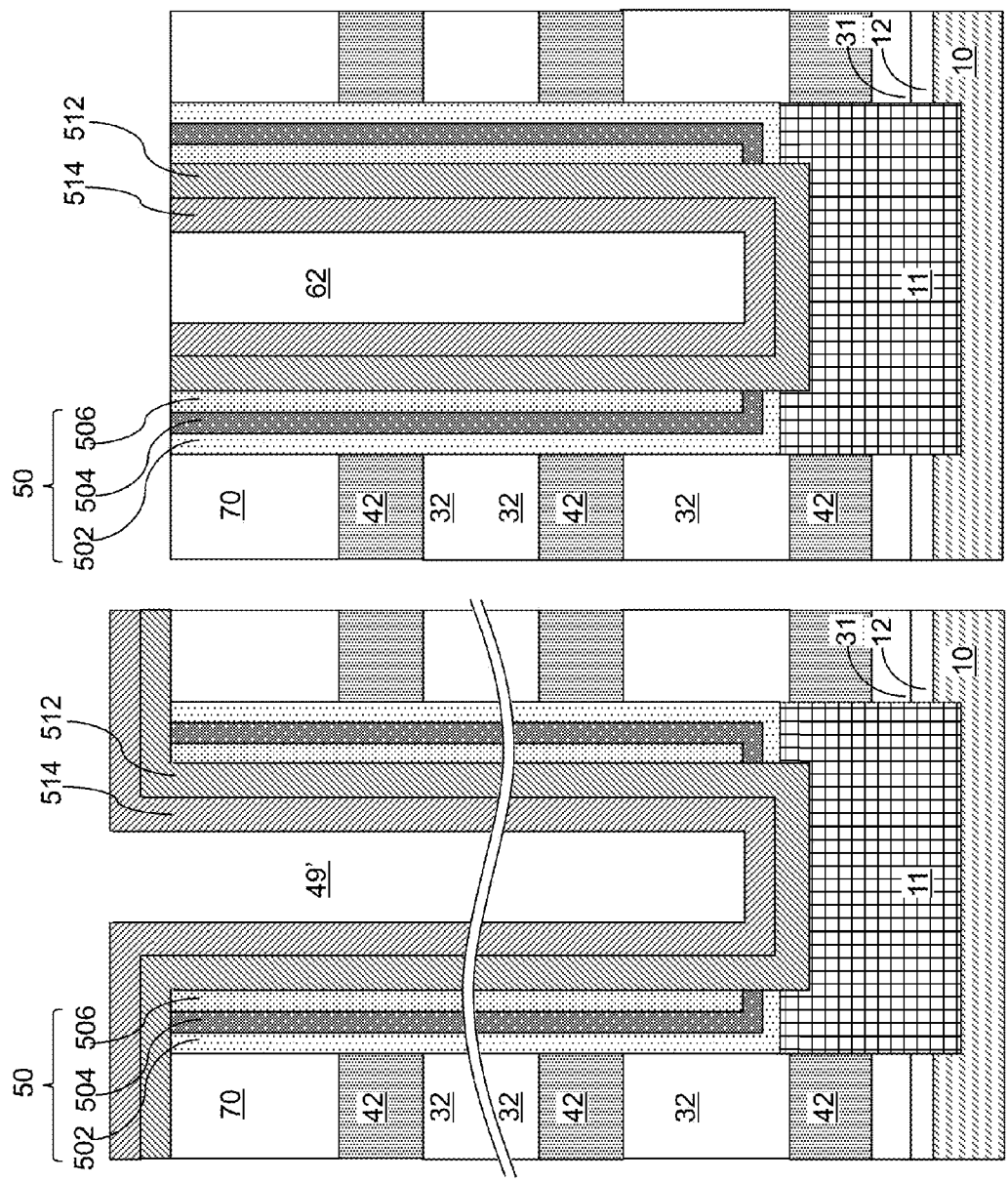

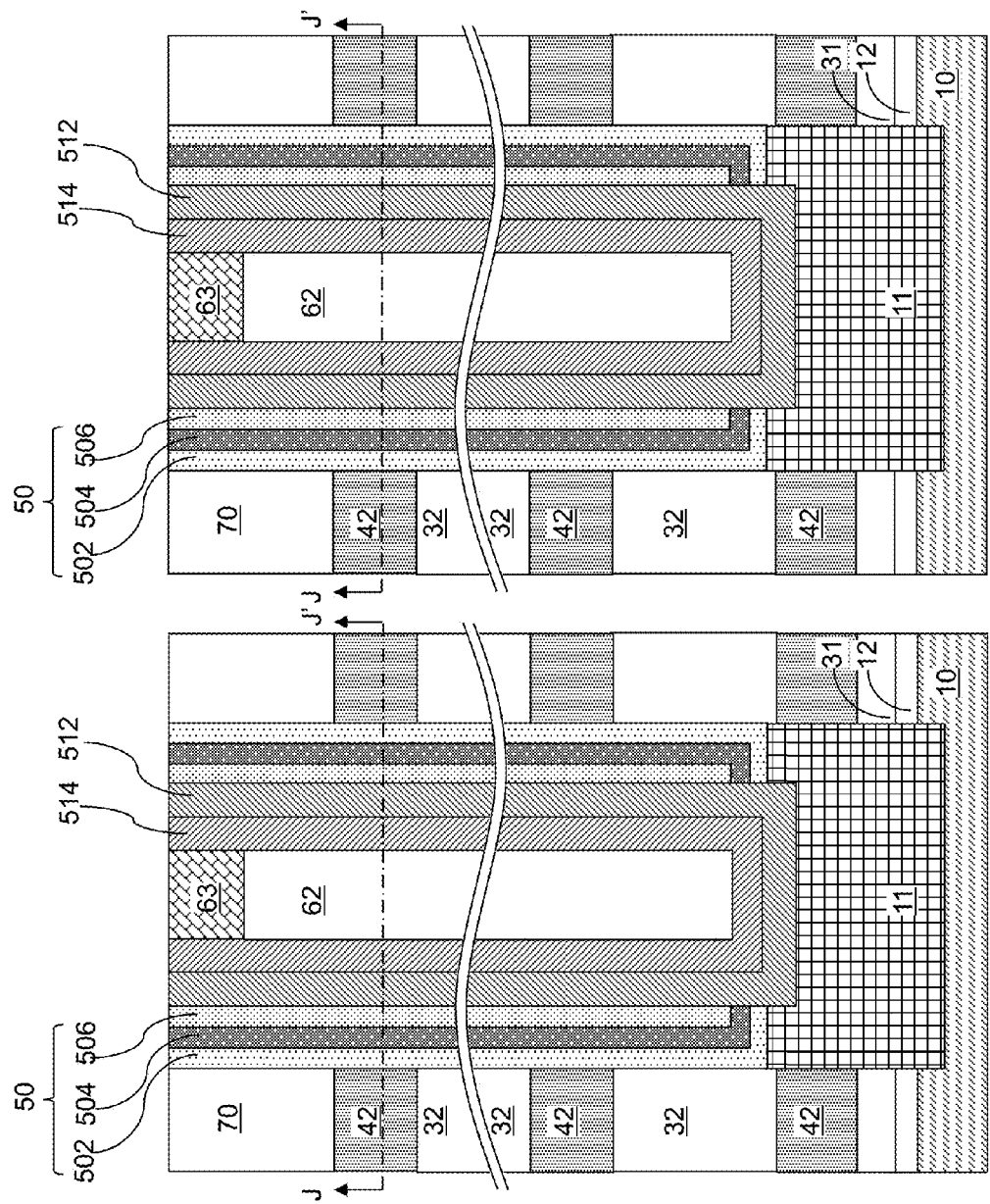

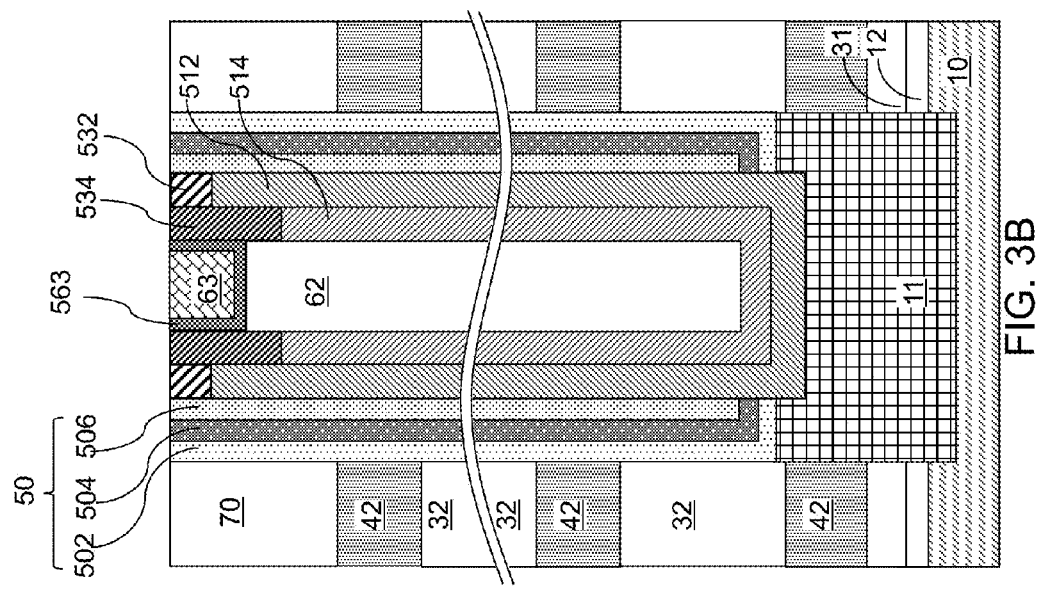
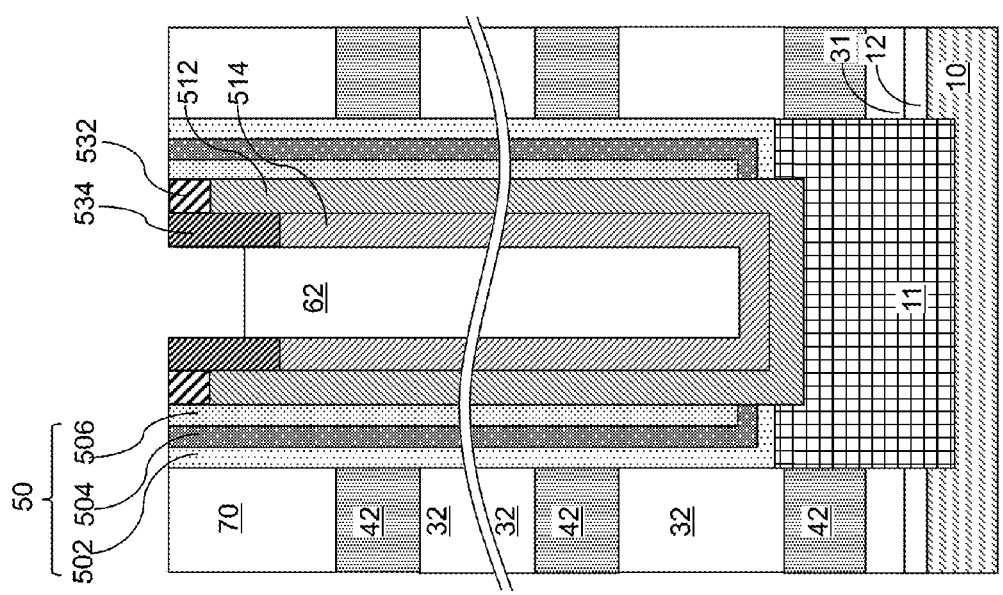

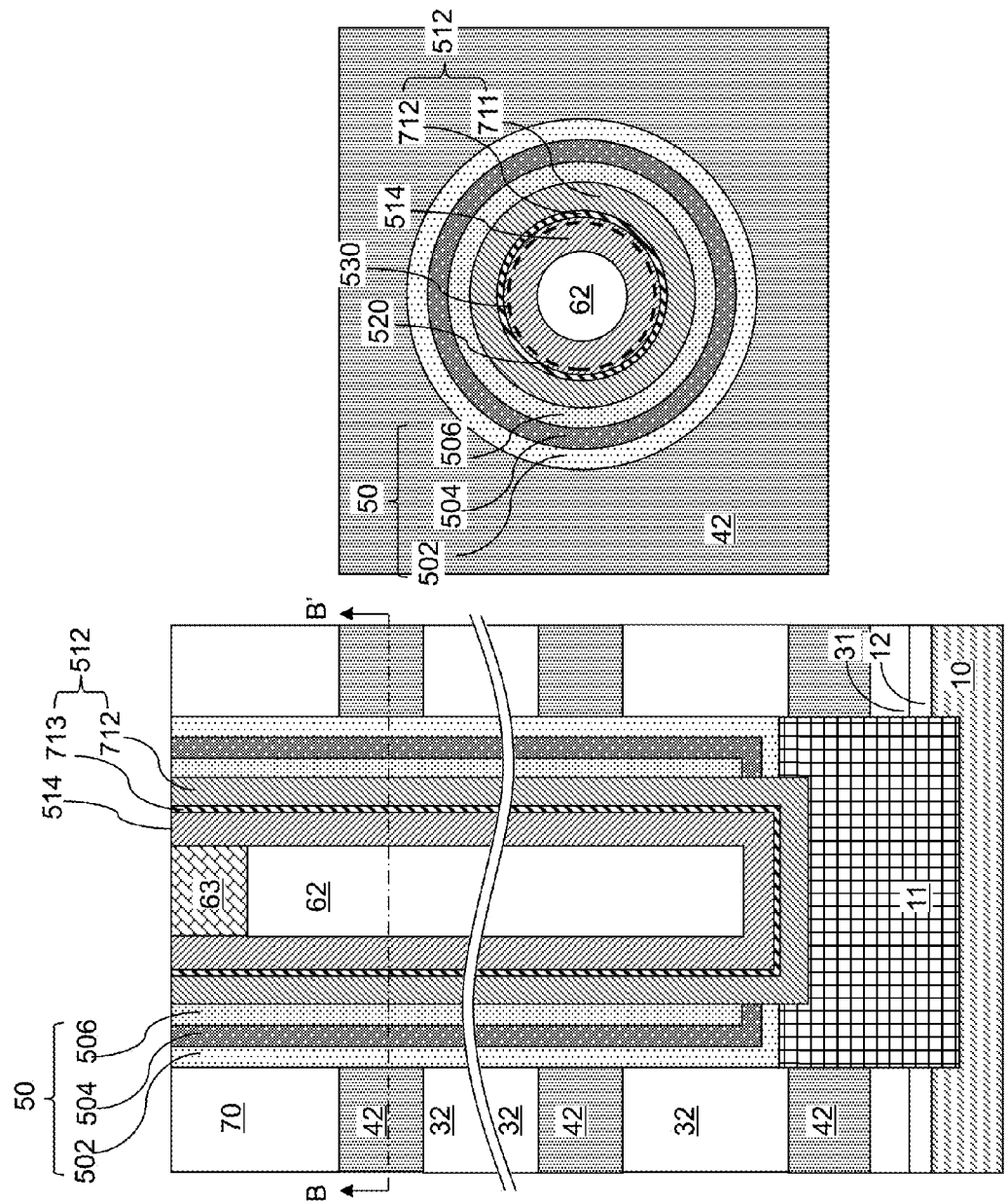

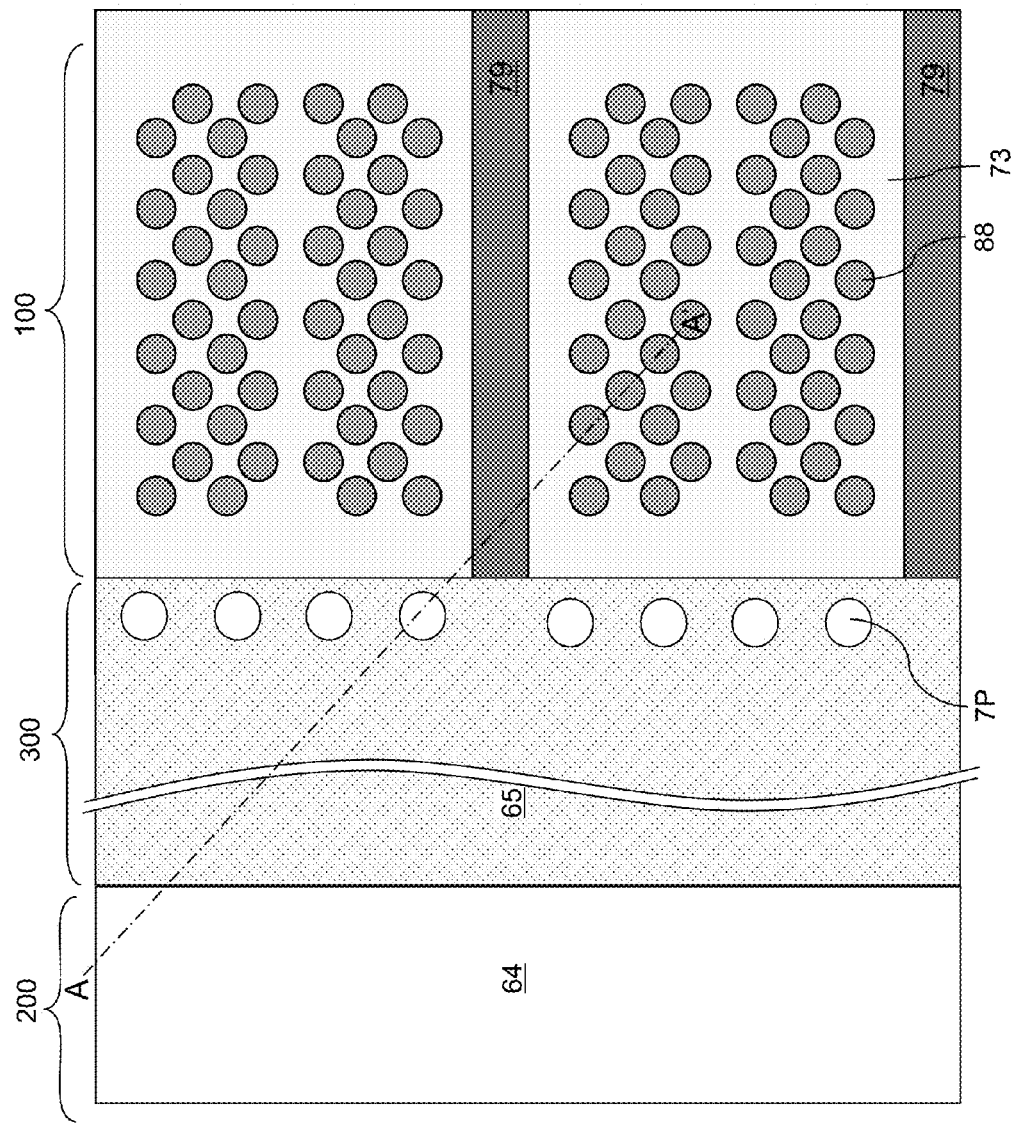

METHOD OF MAKING A THREE-DIMENSIONAL MEMORY DEVICE HAVING A HETEROSTRUCTURE QUANTUM WELL CHANNEL

FIELD

The present disclosure relates generally to the field of semiconductor devices and specifically to three-dimensional semiconductor devices, such as vertical NAND strings, and methods of making thereof.

BACKGROUND

Three-dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a monolithic three-dimensional memory device is provided, which includes a stack of alternating layers comprising insulating layers and electrically conductive layers and located over a substrate; a memory opening vertically extending through the stack of alternating layers; a memory film located at a periphery of the memory opening; a semiconductor channel extending through the memory opening and located over the memory film and comprising: a first semiconductor material layer having a first band gap and located over the memory film; and a second semiconductor material layer having a second band gap that is narrower than the first band gap and located over the first semiconductor material layer. A two-dimensional electron gas for electrical current conduction is present at, or in proximity to, an interface between the first semiconductor material layer and the second semiconductor material layer.

According to another aspect of the present disclosure, a method of forming a monolithic three-dimensional memory device is provided. A stack of alternating layers comprising first material layers and second material layers is formed over a substrate. A memory opening is formed through the stack of alternating layers. A memory film is formed in the memory opening. A first semiconductor material layer having a first band gap is formed over the memory film. A second semiconductor material layer having a second band gap that is narrower than the first band gap is formed over the first semiconductor material layer. A heterostructure quantum well is formed at an interface between the first semiconductor material layer and the second semiconductor material layer.

BRIEF DESCRIPTION OF THE DRAWINGS

FIGS. 2A-2J are sequential vertical cross-sectional views of a memory opening during formation of a first exemplary memory stack structure according to a first embodiment of the present disclosure.

FIGS. 3A and 3B are sequential vertical cross-sectional views of a memory opening during formation of a second exemplary memory stack structure according to a second embodiment of the present disclosure.

FIG. 5A is a vertical cross-sectional view of a memory opening including a fourth exemplary memory stack structure according to a third embodiment of the present disclosure.

FIG. 5B is a horizontal cross-sectional view of the fourth exemplary memory stack structure along the horizontal plane B-B' of FIG. 5A.

FIG. 8B is a partial see-through top-down view of the exemplary device structure of FIG. 8A. The vertical plane A-A' is the plane of the vertical cross-sectional view of FIG. 8A.

DETAILED DESCRIPTION

Figure 1:
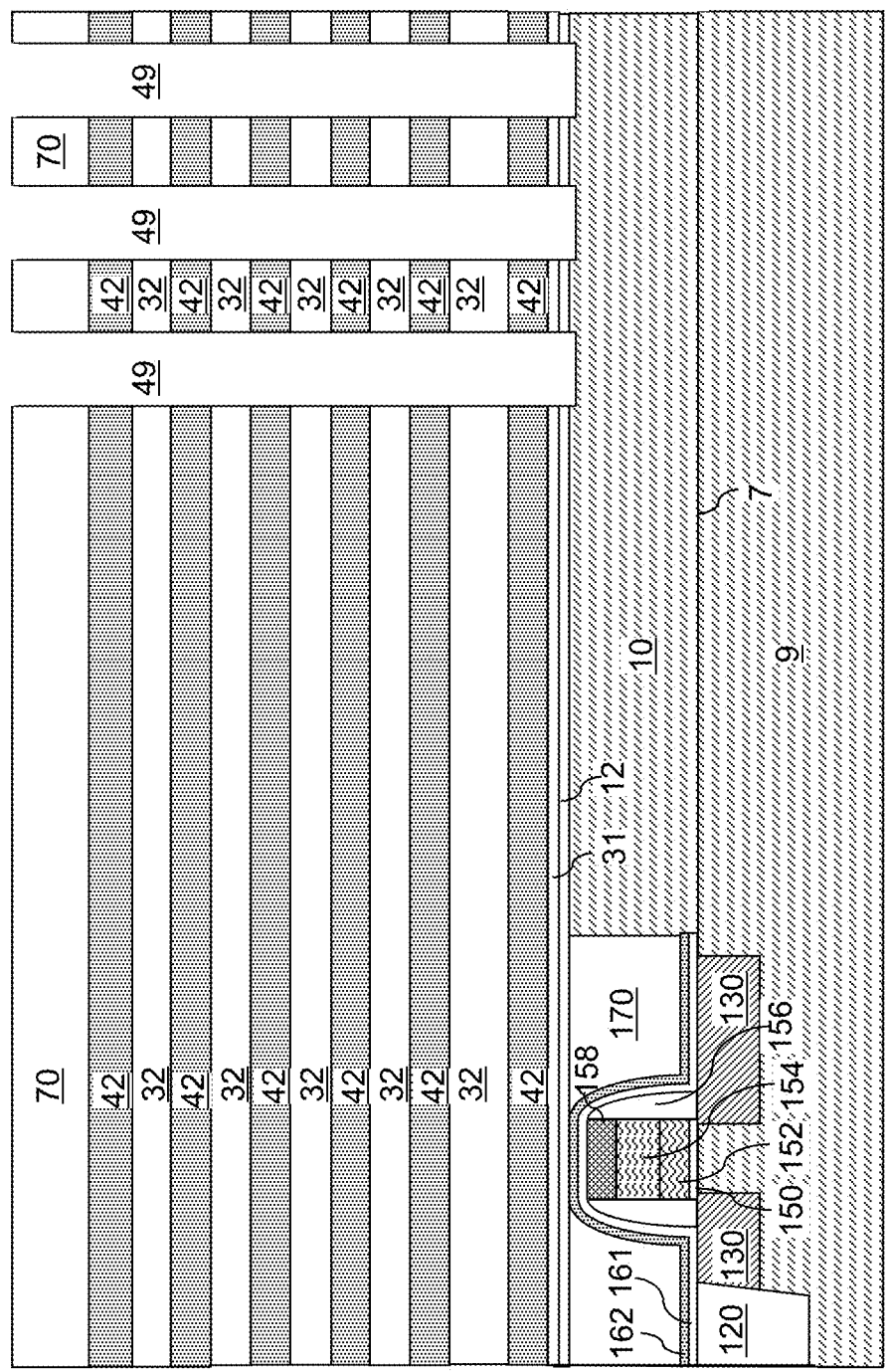
FIG. 1 is a vertical cross-sectional view of an exemplary device structure after formation of a stack including an alternating plurality of material layers and memory openings extending through the stack according to an embodiment of the present disclosure.

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a substantially uniform thickness. A layer may extend over the entirety of an underlying or overlying structure, or may have an extent less than the extent of an underlying or overlying structure. Further, a layer may be a region of a homogeneous or inhomogeneous contiguous structure that has a thickness less than the thickness of the contiguous structure. For example, a layer may be located between any pair of horizontal planes between, or at, a top surface and a bottom surface of the contiguous structure, or at or on a sidewall surface or a tapered surface. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary device structure according to an embodiment of the present disclosure is illustrated, which can be employed, for example, to fabricate a device structure containing vertical NAND memory devices. The exemplary device structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface.

As used herein, a "semiconductor material" refers to a material having electrical conductivity in the range from $1.0 \times 10^{-6}$ S/cm to $1.0 \times 10^5$ S/cm, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. A material is "semiconducting" if the electrical conductivity is in a range from $1.0 \times 10^{-6}$ S/cm to $1.0 \times 10^5$ S/cm. All measurements for electrical conductivities are made at the standard condition. Optionally, at least one doped well (not expressly shown) can be formed within the substrate semiconductor layer 9.

At least one semiconductor device for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170. The semiconductor material layer 10 can be doped with p-type dopants or n-type dopants. The type of doping of the semiconductor material layer 10 is herein referred to as a first conductivity type. In case a semiconductor material layer 10 is not formed, the substrate semiconductor layer can be doped with p-type dopants or n-type dopants, and the type of doping of the substrate semiconductor layer 9 is referred to as a first conductivity type. In one embodiment, the first conductivity type can be p-type.

Optionally, a dielectric pad layer 12 can be formed above the semiconductor material layer 10 and the planarization dielectric layer 170. The dielectric pad layer 12 can be, for example, silicon oxide layer. The thickness of the dielectric pad layer 12 can be in a range from 3 nm to 30 nm, although lesser and greater thicknesses can also be employed.

A dielectric cap layer 31 can be optionally formed. The dielectric cap layer 31 includes a dielectric material, and can be formed directly on top surfaces of the gate electrodes (152, 154). Exemplary materials that can be employed for the dielectric cap layer 31 include, but are not limited to, silicon oxide, a dielectric metal oxide, and silicon nitride (in case the material of second material layers to be subsequently formed is not silicon nitride). The dielectric cap layer 31 provides electrical isolation for the gate electrodes (152, 154).

A stack of an alternating plurality of first material layers (which can be insulating layers 32) and second material layers (which can be sacrificial material layer 42) is formed over the top surface of the substrate, which can be, for example, on the top surface of the dielectric cap layer 31. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, low dielectric constant (low-k) insulating materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide and/or organosilicate glass.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium. Alternatively, permanent electrically conductive layers may be employed in lieu of the sacrificial material layers 42. The permanent electrically conductive layers may comprise a conductive material such as a metal, polysilicon, a metal silicide (e.g., nickel silicide). In this case, the permanent electrically conductive layers are not replaced with a different material, and serve as control gate electrodes of vertical NAND device.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Subsequently, a lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the dielectric cap layer 31 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The memory openings 49 are formed through the dielectric cap layer 31 and the dielectric pad layer 12 so that the memory openings 49 extend from the top surface of the alternating stack (32, 42) to the top surface of the semiconductor material layer 10 within the substrate between the lower select gate electrodes. In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can extend to a top surface of the substrate semiconductor layer 9.

A memory stack structure can be formed in each of the memory opening employing various embodiments of the present disclosure. FIGS. 2A-2F illustrate sequential vertical cross-sectional views of a memory opening within the exemplary device structure during formation of a first exemplary memory stack structure according to a first embodiment of the present disclosure. Formation of the exemplary memory stack structure can be performed within each of the memory openings 49 in the exemplary device structure illustrated in FIG. 1.

Referring to FIG. 2A, a memory opening 49 in the exemplary device structure of FIG. 1 is illustrated. The memory opening 49 extends through the insulating cap layer 70, the alternating stack (32, 42), the dielectric cap layer 31, the dielectric pad layer 12, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 2B, an optional epitaxial pedestal 11 can be formed at the bottom portion of each memory opening 49, for example, by selective epitaxy. Each epitaxial pedestal 11 comprises a single crystalline semiconductor material in epitaxial alignment with the single crystalline semiconductor material of the semiconductor material layer 10. In one embodiment, the epitaxial pedestal 11 can be doped with electrical dopants of the same conductivity type as the semiconductor material layer 10. In one embodiment, the top surface of each epitaxial pedestal 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial pedestals 11 with a respective conductive material layer. The epitaxial pedestal 11 can be a portion of a semiconductor channel that extends between a source region to be subsequently formed in the substrate (9, 10) and a drain region to be subsequently formed in an upper portion of the memory opening 49. A cavity 49' is present in the unfilled portion of the memory opening 49 above the epitaxial pedestal 11. In one embodiment, the epitaxial pedestal 11 can comprise single crystalline silicon. In another embodiment, the epitaxial pedestal can comprise a compound semiconductor, such as a III-V semiconductor material, for example GaAs. In one embodiment, the epitaxial pedestal 11 can have a doping of the first conductivity type, which is the same as the conductivity type of the semiconductor material layer 11 that the epitaxial pedestal contacts. If a semiconductor material layer 10 is not present, the epitaxial pedestal 11 can be formed directly on the substrate semiconductor layer 9, which can have a doping of the first conductivity type.

Referring to FIG. 2C, a stack of layers including a blocking dielectric layer 502L, a memory material layer 504L, a tunneling dielectric layer 506L, and an optional sacrificial cover layer 508L can be sequentially deposited in the memory openings 49.

The blocking dielectric layer 502L can be deposited on the sidewalls of each memory opening 49 by a conformal deposition method. The blocking dielectric layer 502L includes a dielectric material, which can be silicon oxide, silicon oxynitride, silicon nitride, a dielectric metal oxide, or a combination thereof. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 502L can include a dielectric metal oxide having a dielectric constant greater than 7.9, i.e., having a dielectric constant greater than the dielectric constant of silicon nitride.

The blocking dielectric layer 502L can be formed by a conformal deposition method such as low pressure chemical vapor deposition, atomic layer deposition, or a combination thereof. The thickness of the blocking dielectric layer 502L can be in a range from 1 nm to 40 nm, although lesser and greater thicknesses can also be employed. The blocking dielectric layer 502L can subsequently function as a dielectric material portion that blocks leakage of stored electrical charges to control gate electrodes. In one embodiment, the blocking dielectric layer 502L includes aluminum oxide. Alternately or additionally, another blocking dielectric layer can be formed after formation of backside recesses on outer surfaces of memory films to be subsequently formed. In case an additional blocking dielectric layer is subsequently formed, the blocking dielectric layer 502L can be omitted.

Subsequently, the memory material layer 504L can be formed. In one embodiment, the memory material layer 504L can be a contiguous layer or patterned discrete portions of a charge trapping material including a dielectric charge trapping material, which can be, for example, silicon nitride. Alternatively, the memory material layer 504L can include a contiguous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the memory material layer 504L includes a silicon nitride layer. In one embodiment, the sacrificial material layers 42 and the insulator layers 32 can have vertically coincident sidewalls, and the memory material layer 504L can be formed as a single contiguous layer. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

In another embodiment, the sacrificial material layers 42 can be laterally recessed with respect to the sidewalls of the insulator layers 32, and a combination of a deposition process and an anisotropic etch process can be employed to form the memory material layer 504L as a plurality of memory material portions that are vertically spaced apart. While the present disclosure is described employing an embodiment in which the memory material layer 504L is a single contiguous layer, embodiments are expressly contemplated herein in which the memory material layer 504L is replaced with a plurality of memory material portions (which can be charge trapping material portions or electrically isolated conductive material portions) that are vertically spaced apart.

The memory material layer 504L can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 504L may comprise an insulating charge trapping material, such as one or more silicon nitride segments. Alternatively, the memory material layer 504L may comprise conductive nanoparticles such as metal nanoparticles, which can be, for example, ruthenium nanoparticles. The memory material layer 504L can be formed, for example, by chemical vapor deposition (CVD), atomic layer deposition (ALD), physical vapor deposition (PVD), or any suitable deposition technique for storing electrical charges therein. The thickness of the memory material layer 504L can be in a range from 2 nm to 20 nm, although lesser and greater thicknesses can also be employed.

The tunneling dielectric layer 506L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 506L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 506L can include a stack of a first silicon oxide layer, a silicon oxynitride layer, and a second silicon oxide layer, which is commonly known as an ONO stack. In one embodiment, the tunneling dielectric layer 506L can include a silicon oxide layer that is substantially free of carbon or a silicon oxynitride layer that is substantially free of carbon. The thickness of the tunneling dielectric layer 506L can be in a range from 2 nm to 20 nm, although lesser and greater thicknesses can also be employed.

In one embodiment, the tunneling dielectric layer 506L can be optimized for a semiconductor channel containing a cylindrical confinement electron gas. In one embodiment, the tunneling dielectric layer 506L can include at least an outermost tunneling dielectric layer that provides a band gap property that induces stable charge storage in the memory material layer 504L, and an innermost tunneling dielectric layer that provides a low defect density interface with a III-V compound semiconductor material to be subsequently deposited as a semiconductor channel material. One or more intermediate dielectric material layers may, or may not, be provided between the outermost tunneling dielectric layer and the innermost tunneling dielectric layer of the tunneling dielectric layer 506L.

In one embodiment, the dielectric material of the outermost tunneling dielectric layer of the tunneling dielectric layer 506L can be selected to provide sufficient energy level difference with respect to the energy level of the memory material layer 504L employed to store electrical charges. In one embodiment, the memory material layer 504L can be composed predominantly of silicon nitride, and silicon oxide layer can be employed as the outermost tunneling dielectric layer of the tunneling dielectric layer 506L. The thickness of the outermost tunneling dielectric layer of the tunneling dielectric layer 506L can be in a range from 3 nm to 10 nm, although lesser and greater thicknesses can also be employed.

If one or more intermediate dielectric material layer are provided within the tunneling dielectric layer 506L, the one or more intermediate dielectric material layers can include a silicon nitride layer, a silicon oxynitride layer, a silicon oxide layer, a dielectric metal oxide layer having a different composition than the innermost tunneling dielectric layer to be subsequently formed, or a stack thereof. The thickness of the one or more intermediate dielectric material layers of the tunneling dielectric layer 506L can be in a range from 0.5 nm to 10 nm, although lesser and greater thicknesses can also be employed.

In one embodiment, the innermost tunneling dielectric layer can include a dielectric metal oxide providing reduced interface defect density for a III-V compound semiconductor material of the semiconductor channel to be subsequently formed. In one embodiment, the innermost tunneling dielectric layer can include aluminum oxide as the dielectric metal oxide, and a wide band gap III-V compound semiconductor material such as AlGaAs can be employed as the compound semiconductor material of the semiconductor channel to be subsequently formed. The thickness of the innermost tunneling dielectric layer of the tunneling dielectric layer 506L can be in a range from 0.5 nm to 10 nm, although lesser and greater thicknesses can also be employed.

In case the tunneling dielectric layer 506L comprises a lateral stack of dielectric layers, the outermost tunneling dielectric layer within the lateral stack can comprises silicon oxide, and the innermost tunneling dielectric layer within the lateral stack can comprise a dielectric metal oxide such as aluminum oxide. If the lateral stack comprises at least one intermediate tunneling dielectric layer, the lateral stack can be formed by depositing at least one intermediate tunneling dielectric layer after formation of the outermost tunneling dielectric layer and prior to formation of the innermost tunneling dielectric layer. In one embodiment, the at least one intermediate tunneling dielectric layer can be a silicon nitride layer. In another embodiment, the at least one intermediate tunneling dielectric layer can be a dielectric metal oxide layer (for example, a lanthanum oxide layer, a hafnium oxide layer, and/or a zirconium oxide layer) having a different composition than the innermost tunneling dielectric layer. In yet another embodiment, the at least one intermediate tunneling dielectric layer can comprise a stack, from outside to inside, a first intermediate tunneling dielectric layer selected from a silicon nitride layer and a dielectric metal oxide layer, and a second intermediate tunneling dielectric layer selected from a silicon oxide layer and a silicon oxynitride layer. In one embodiment, each of the at least one intermediate tunneling dielectric layer can be selected from a silicon nitride layer, a lanthanum oxide layer, a hafnium oxide layer, a zirconium oxide layer, and a silicon oxynitride layer. The total thickness of the tunneling dielectric layer 506L can be in a range from 2 nm to 30 nm, although lesser and greater thicknesses can also be employed.

The optional sacrificial cover layer 508L comprises a sacrificial material that protects vertical portions of the tunneling dielectric layer 506L during subsequent processing steps. For example, the optional sacrificial cover layer 508L can comprise an amorphous or polycrystalline semiconductor material such as amorphous or polycrystalline silicon, a carbon-based material such as amorphous carbon or diamond-like carbon (DLC), or any other material that can protect the vertical portions of the tunneling dielectric layer 506L during a subsequent anisotropic etch or horizontal portions of the stack of layers (508L, 506L, 504L, 502L). The sacrificial cover layer 508L can be deposited by a conformal deposition process such as chemical vapor deposition (CVD) or atomic layer deposition (ALD). The sacrificial cover layer 508L can have a thickness in a range from 3 nm to 12 nm, although lesser and greater thicknesses can also be employed.

Referring to FIG. 2D, the optional sacrificial cover layer 508L, the tunneling dielectric layer 506L, the memory material layer 504L, the blocking dielectric layer 502L are sequentially anisotropically etched employing at least one anisotropic etch process. The horizontal portions of the optional sacrificial cover layer 508L, the tunneling dielectric layer 506L, the memory material layer 504L, and the blocking dielectric layer 502L located above the top surface of the insulating cap layer 70 can be removed by the at least one anisotropic etch process. Further, the horizontal portions of the optional sacrificial cover layer 508L, the tunneling dielectric layer 506L, the memory material layer 504L, and the blocking dielectric layer 502L at a bottom of each cavity 49' can be removed to form openings in remaining portions thereof.

The remaining portion of the optional sacrificial cover layer 508L in the memory opening 49 constitutes a sacrificial cover portion 508. The remaining portion of the tunneling dielectric layer 506L in the memory opening 49 constitutes a tunneling dielectric 506.

The remaining portion(s) of the memory material layer 504L in the memory opening 49 is herein referred to as charge storage elements 504. The charge storage elements 504 can be a contiguous layer of a charge trapping material having a generally cylindrical shape, or can be a plurality of ring-shaped charge trapping material portions located at each level of the sacrificial material layers or variants thereof. In one embodiment, the charge storage elements 504 can be a contiguous layer, i.e., can be a memory material layer. In case the charge storage elements 504 is a memory material layer, i.e., a contiguous layer of charge trapping material, each portion of the contiguous layer located at each level of the sacrificial material layers 42 can be subsequently employed as a charge trapping material portion that is electrically isolated from other charge trapping material portions by regions of the contiguous layer located at the levels of the insulator layers 32.

Each remaining portion of the blocking dielectric layer 502L is herein referred to as a blocking dielectric 502. A surface of the epitaxial pedestal 11 can be physically exposed underneath the opening through the sacrificial cover portion 508, the tunneling dielectric 506, the charge storage elements 504, and the at least one blocking dielectric (501, 503). Optionally, the physically exposed portion of the epitaxial pedestal 11 can be vertically recessed. A tunneling dielectric 506 is located on, and embedded within, the charge storage elements 504. The charge storage elements 504 can comprise a charge trapping material or a floating gate material. Optionally, the tunneling dielectric 506, the charge storage elements 504, and the blocking dielectric 502 can be laterally recessed with respect to an inner sidewall of the sacrificial cover portion 508. A set of adjoining material portions including a blocking dielectric 502, charge storage elements 504, and a tunneling dielectric 506 within a memory opening 49 constitutes a memory film 50.

Referring to FIG. 2E, the sacrificial cover portion 508 can be removed, for example, by an isotropic etch. If the sacrificial cover portion 508 comprises a semiconductor material, a wet etch process can be employed to remove the sacrificial cover portion 508. In this case, a surface portion of the epitaxial pedestal 11 may be collaterally etched. If the sacrificial cover portion 508 comprises a carbon-based material, the sacrificial cover portion 508 can be removed, for example, by ashing. A suitable clean process may be optionally performed afterwards. If desired, the exposed surface of the tunneling dielectric 506 may be cleaned, such as by an anneal in a hydrogen atmosphere at 700 to 750° C.

Referring to FIG. 2F, a first semiconductor material layer 512 is deposited over (e.g., preferably directly on) the physically exposed surfaces of the epitaxial pedestal 11, the memory film 50, and the insulating cap layer 70. The first semiconductor material layer 512 comprises a first compound semiconductor material having a first band gap. As used herein, a "band gap" refers to the energy difference (in electron volts) between the top of the valence band and the bottom of the conduction band in insulator materials and semiconductor materials. The first compound semiconductor material can be a III-V compound semiconductor material. In one embodiment, the first compound semiconductor material can be selected from AlGaAs, GaAs, InAlAs, and InGaAlAs. It should be understood that the ternary and quaternary materials may have various formulas, such as $(Al_xGa_{1-x})As$ where x is greater than zero and less than one, for example x may range from 0.1 to 0.4, such as 0.2 to 0.25, and $(In_xAla_{1-x})As$ where x is greater than zero and less than one, for example x may range from 0.2 to 0.4, such as 0.3 to 0.32.

The first compound semiconductor material of the first semiconductor material layer 512 can include a crystalline semiconductor material or an amorphous semiconductor material. As used herein, a "crystalline material" refers to a material that is single crystalline or polycrystalline. The first semiconductor material layer 512 can be formed by a conformal deposition method such as metal organic chemical vapor deposition (MOCVD). Optionally, a nucleation layer having a different composition than the bulk composition of the first semiconductor material layer 512 may be employed to increase the average grain size of the first semiconductor material layer 512. For example, a thin Group III metal nucleation layer may be employed to facilitate crystalline growth of the first semiconductor material layer 512, as will be described in more detail below.

A semiconductor film may be roughly classified as crystalline or amorphous. An amorphous semiconductor film has disordered atomic arrangement and no crystalline component. An example is a semiconductor film in which no crystal part exists even in a microscopic region. Crystalline semiconductor films include single-crystal and non-single-crystal semiconductor films.

A non-single crystal semiconductor film can be crystalline to a different degree. For instance, a polycrystalline semiconductor film is comprised of "grains". Within each grain, the material is in the crystalline phase. That is, within each grain, the crystalline structure is oriented in the same way. However, in different grains, the crystal orientation may be different. As the term is used herein, a polycrystalline semiconductor material includes nanocrystals, microcrystals, or even larger crystals. The terminology depends on the grain size. Nanocrystals have an average grain size on the order of one nanometer ($1\times10^{-9}$ meter) to hundreds of nanometers. Microcrystals have an average grain size on the order of one micrometer ($1\times10^{-6}$ meter) to hundreds of micrometers. Thus, a polycrystalline semiconductor material can have a higher degree of atomic order than an amorphous semiconductor material. Hence, the density of defect states of the poly-crystalline semiconductor film is lower than that of the amorphous semiconductor film.

In one embodiment, the first semiconductor material layer 512 can include a single crystalline semiconductor material. In another embodiment, the first semiconductor material layer 512 can include a polycrystalline semiconductor material. In one embodiment, the lateral dimensions of the grains of the polycrystalline semiconductor material parallel to the sidewalls of the first semiconductor material layer 512 can be greater than the height (i.e., the vertical dimension in the opening 49) of the first semiconductor material layer 512. The height of layer 512 in opening 49 is perpendicular to the major surface 7 of the substrate. In one embodiment, the lateral dimensions of the grains of the polycrystalline semiconductor material parallel to the sidewalls of the first semiconductor material layer 512 can be greater than the thickness (i.e., the horizontal dimension in the opening 49) of the first semiconductor material layer 512 by orders of magnitude (e.g., from 10 times to 1,000 times or greater). The thickness of layer 512 in opening 49 is parallel to the major surface 7 of the substrate. Therefore, the area of a grain may be larger than the area of the portion of layer 512 in some or all openings 49. In this case, the entire portion of layer 512 in some or all openings 49 may be composed of a single grain and thus be single crystalline, while the portion of layer 512 in one or more other openings 49 may be polycrystalline and contain one or more grain boundaries separating two or more grains. Thus, the polycrystalline semiconductor material of the first semiconductor material layer 512 can include large grains that provide substantially the same benefit in terms of charge carrier mobility as a single crystalline semiconductor material, albeit some degradation may be present due to charge carrier scattering at the grain boundaries where they are present.

As used herein, a "large grain crystalline material" refers to a polycrystalline material having an average grain size that is at least 300 nanometers ($300\times10^{-9}$ meter) in at least one direction. Note that for some embodiments of a 3D memory device, the NAND channel is formed from a thin semiconductor film. For example, the semiconductor film may be on the order of tens of nanometers in thickness.

Thus, a large grain of polysilicon may extend 300 nanometers or more in the vertical direction parallel to the NAND string channel. However, a large grain might extend for less than a few hundred nanometers in the horizontal direction perpendicular to the channel.

In one embodiment, the average grain size (as measured along a vertical direction perpendicular to the major surface 7 of the substrate) of the first semiconductor material layer 512 may be on the order of 1 micron, or may be in on the order of several microns, such as 3 to 20 microns, for example 4 to 10 microns or may be on the order of tens of microns. In such cases, the first semiconductor material layer 512 exhibiting substantially the same electrical characteristics as a single crystalline semiconductor material may be provided for devices having a channel that is less than 5 microns high and less than 1 micron thick.

In one embodiment, the grain size along the vertical direction can be greater than 100 nanometers, the charge transport characteristics of the semiconductor material of the first semiconductor material layer 512 approximates the charge transport characteristics of a single crystalline material. The grain size along the vertical direction can be orders of magnitude greater than the thickness of the first semiconductor material layer 512. In this case, most of the grain boundaries can have substantially horizontal orientations that are substantially perpendicular to the direction of the height of the first semiconductor material layer 512.

The thickness of the first semiconductor material layer 512 can be in a range from 2 nm to 30 nm, such as 5 to 15 nm, although lesser and greater thicknesses can also be employed. A cavity 49' is formed in the volume of each memory opening 49 that is not filled with memory film 50 and the first semiconductor material layer 512. The first semiconductor material layer 512 can be formed as a polycrystalline material layer, or can be deposited as an amorphous material layer and subsequently converted into a polycrystalline material layer. In one embodiment, the first semiconductor material layer 512 can be formed as a crystalline material layer.

In one embodiment, the first compound semiconductor material can be an undoped compound semiconductor material. As used herein, an "undoped" compound semiconductor material refers to a compound semiconductor material which is not intentionally doped with Group II or Group IV elements from the Periodic Table.

Referring to FIG. 2G, a second semiconductor material layer 514 is deposited on the first semiconductor material layer 512. Within the memory opening 49, the second semiconductor material layer 514 is deposited over (e.g., inside in the radial direction in opening 49), and preferably directly on, the first semiconductor material layer 512. The second semiconductor material layer 514 comprises a second compound semiconductor material. The second compound semiconductor material can be a III-V compound semiconductor material that is different from the first compound semiconductor material. The pair of the first compound semiconductor material and the second compound semiconductor material can be selected such that the second compound semiconductor material has a second band gap that is narrower (i.e., smaller) than the first band gap of the first compound semiconductor material. In one embodiment, the second compound semiconductor material can be selected from GaAs, InGaAs, InP, InAs, and InGaAsP. For example, InGaAs may have a formula $(In_xGa_{1-x})As$, where x ranges from greater than zero and less than 1, such as 0.15 to 0.33 or 0.65 to 0.73, including 0.7. In an illustrative example, the first compound semiconductor material can be AlGaAs, and the second compound semiconductor material can be GaAs. In another example, the first compound semiconductor material can be AlGaAs, and the second compound semiconductor material can be InGaAs. In yet another example, the first compound semiconductor material can be InAlAs, and the second compound semiconductor material can be GaAs.

The second compound semiconductor material of the second semiconductor material layer 514 can include a crystalline semiconductor material or an amorphous semiconductor material. The second semiconductor material layer 514 can be formed by a conformal deposition method such as metal organic chemical vapor deposition (MOCVD).

In one embodiment, the second semiconductor material layer 514 can include a single crystalline semiconductor material. In another embodiment, the second semiconductor material layer 514 can include a polycrystalline semiconductor material. In one embodiment, the lateral dimensions of the grains of the polycrystalline semiconductor material parallel to the sidewalls of the second semiconductor material layer 514 can be greater than the height of the second semiconductor material layer 514. In one embodiment, the lateral dimensions of the grains of the polycrystalline semiconductor material parallel to the sidewalls of the second semiconductor material layer 514 can be greater than the thickness of the second semiconductor material layer 514 by orders of magnitude (e.g., from 10 times to 1,000 times or greater). In this case, the entire portion of layer 514 in some or all openings 49 may be composed of a single grain and thus be single crystalline, while the portion of layer 514 in one or more other openings 49 may be polycrystalline and contain one or more grain boundaries separating two or more grains. Thus, the polycrystalline semiconductor material of the second semiconductor material layer 514 can include large grains that provide substantially the same benefit in terms of charge carrier mobility as a single crystalline semiconductor material, albeit some degradation may be present due to charge carrier scattering at the grain boundaries where they are present. In other words, both portions of layers 512 and 514 may be single crystalline in some or all openings 49, such that the entire semiconductor channel in some or all openings 49 is single crystalline. Alternatively, one or both portions of layers 512 and 514 in one or more openings may be polycrystalline. In one embodiment, the grain size (as measured along a vertical direction) may be on the order of 1 micron, or may be in on the order of several microns, such as 3 to 20 microns, for example 4 to 10 microns or may be on the order of tens of microns. In such cases, a second semiconductor material layer 514 exhibiting substantially the same electrical characteristics as a single crystalline semiconductor material may be provided. In one embodiment, the grains of the second semiconductor material layer 514 can be in epitaxial alignment with the grains of the first semiconductor material layer 512.

In one embodiment, the grain size along the vertical direction can be greater than 100 nanometers, the charge transport characteristics of the semiconductor material of the second semiconductor material layer 514 approximates the charge transport characteristics of a single crystalline material. In one embodiment, the second semiconductor material layer can include a large grain polycrystalline material. The grain size along the vertical direction can be orders of magnitude greater than the thickness of the second semiconductor material layer 514. In this case, most of the grain boundaries can have substantially horizontal orientations that are substantially perpendicular to the direction of the height of the second semiconductor material layer 514.

The thickness of the second semiconductor material layer 514 can be in a range from 2 nm to 30 nm, such as 5-10 nm, although lesser and greater thicknesses can also be employed. A cavity 49' is present in the volume of each memory opening 49 that is not filled with memory film 50, the first semiconductor material layer 512, and the second semiconductor material layer 514. The second semiconductor material layer 514 can be formed as a single crystalline or polycrystalline material layer, or can be deposited as an amorphous material layer and subsequently converted into a polycrystalline material layer.

In one embodiment, the first and second semiconductor material layers (512, 514) can be formed as amorphous layers, and can be annealed after deposition of the second semiconductor material layer 514 (which may be prior to, or after, formation of a dielectric core) to convert the amorphous first and second semiconductor material layers (512, 514) into a crystalline semiconductor channel. In this case, the average grain size of the polycrystalline channel may be orders of magnitude greater than the total thickness of the first and second semiconductor material layers (512, 514). In another embodiment, layers 512 and 514 may be grown as crystalline (e.g., single crystalline or large grain polycrystalline) layers at different temperatures using a Group III metal nucleation layer. For example, the wider band gap semiconductor material layer 512 may be grown at a higher temperature than the narrower band gap semiconductor material layer 514. In one exemplary embodiment, the method of depositing single crystalline or large grain polycrystalline III-V layers may be similar to the method of forming crystalline III-V layers on silicon and insulating substrates that is described in U.S. Pat. No. 8,603,898, which is incorporated herein by reference in its entirety, or any other suitable methods, such as the method described below. In one embodiment method, the substrate containing the memory film 50 in the openings may optionally be heated to remove contaminants in a pre-clean step for 10 seconds to 2 minutes at a temperature of 360 to 650° C. After the pre-clean step, a thin Group III metal nucleation layer (e.g., 1 to 5 nm thick layer), such as an Al, Ga or In layer is formed over (e.g., directly on) the memory film by MOCVD at a temperature of 360 to 400° C. for less than 15 seconds, e.g., 3 to 10 seconds by supplying the Group III precursor (e.g., TMA or TMG) into the MOCVD chamber without supplying the Group V precursor (e.g., arsine). After deposition of the nucleation layer, the wider band gap semiconductor material layer 512 is deposited on the nucleation layer by flowing a Group III precursor (e.g., TMG and TMA) and a Group V precursor (e.g., arsine) into the MOCVD chamber. The wider band gap semiconductor material layer 512 may comprise AlGaAs grown at 360 to 400° C. for 1 to 10 minutes. The narrower band gap semiconductor material layer 514 may comprise GaAs grown at 300 to 350° C. for 1 to 10 minutes. After each layer 512, 514 is grown, the MOCVD precursor (e.g., TMG, TMA, arsine, etc.) flow is stopped and the layer is self annealed for 30 seconds to 5 minutes either at the growth temperature or at a higher temperature (e.g., 400 to 500° C.) than the growth temperature before the next layer is deposited. If desired the above described pre-clean anneal in a hydrogen ambient may also be used before the growth of one or more layers. Preferably, a buffer layer is omitted such that layer 512 is deposited directly on the Group III metal nucleation layer. The thin nucleation layer may be merged into layer 512 during growth of layer 512 such that no pure group III metal layer remains between layer 512 and the memory film (i.e., the metal nucleation layer may react with arsenic to form a III-V semiconductor layer, such as a Group III-rich III-V semiconductor layer).

In one embodiment, the second compound semiconductor material can be an undoped compound semiconductor material. In one embodiment, the first compound semiconductor material of the first semiconductor material layer 512 and the second compound semiconductor material of the second semiconductor material layer 514 can be undoped.

In one embodiment, the single crystal material of the pedestal 11 is different in composition from the crystalline III-V compound semiconductor material of the semiconductor channel. For example, the pedestal may comprise single crystal silicon while layers 512 and 514 may comprise III-V semiconductor materials which are different from silicon. In another embodiment, the single crystal material of the pedestal 11 comprises a material that is the same in composition as the first 512 or the second 514 semiconductor material layers of the semiconductor channel. For example, the pedestal 11 may comprise a III-V semiconductor material, such as GaAs or AlGaAs which is the same as the III-V semiconductor material of layers 512 or 514.

Referring to FIG. 2H, in case the cavity 49' in each memory opening is not completely filled by the second semiconductor material layer 514, a dielectric core layer can be deposited in the cavity 49' to fill any remaining portion of the cavity 49' within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating. If desired, a conformal metal oxide layer, such as an aluminum oxide layer, may be formed over layer 514 by CVD or ALD before formation of the dielectric core layer.

The horizontal portion of the dielectric core layer 62L above the top surface of the insulating cap layer 70 can be removed by a planarization process from above the top surface of the insulating cap layer 70. The planarization process can employ, for example, by a recess etch or chemical mechanical planarization. Further, the horizontal portion of the first and second semiconductor material layers (512, 514) located above the top surface of the insulating cap layer 70 can be removed by another planarization process, which can employ a recess etch or chemical mechanical planarization (CMP). Vertical portions of the first and second semiconductor material layers (512, 514) remain in the memory opening 49.

The first and second semiconductor material layers (512, 514) collectively constitute a semiconductor channel. A heterojunction is formed between two different semiconductor materials at the interface between the first semiconductor material layer 512 and the second semiconductor material layer 514. The heterojunction can have a configuration of a cylindrical sheet extending vertically (e.g., perpendicular to the top surface 7 of the substrate). In one embodiment, the cylindrical sheet can have a substantially uniform horizontal cross-sectional shape, which can be an ellipse, a circle, or a general polygonal and/or curvilinear closed shape.

Referring to FIG. 2I, the top surface of the remaining portion of the dielectric core layer can be recessed to form a recess region within each memory opening 49, for example, by a recess etch to a depth that is located between the top surface of the insulating cap layer 70 and the bottom surface of the insulating cap layer 70. Each remaining portion of the dielectric core layer constitutes a dielectric core 62.

Figure 2K:
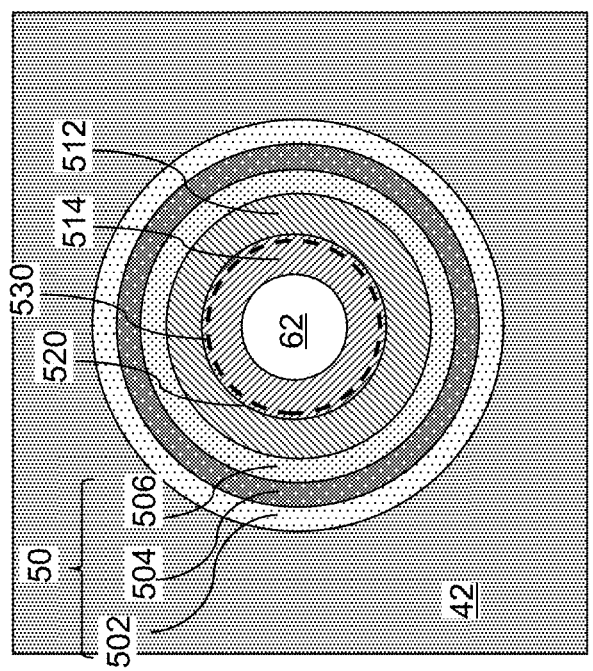
FIG. 2K is a horizontal cross-sectional view of the first exemplary memory stack structure along the horizontal plane J-J' of FIG. 2J.

Referring to FIGS. 2J and 2K, a drain region 63 can be formed by depositing a doped semiconductor material within the recessed region above the dielectric cores 62. The doped semiconductor material can be, for example, doped polysilicon or a doped compound semiconductor material. In one embodiment, the doped semiconductor material can have a doping of a second conductivity type that is the opposite of the first conductivity type. For example, if the first conductivity type is p-type, the second conductivity type can be n-type. In one embodiment, the atomic concentration of the dopants of the second conductivity type in the doped semiconductor material can be in a range from $1.0 \times 10^{19}/cm^3$ to $2.0 \times 10^{21}/cm^3$, although lesser and greater atomic concentrations can also be employed. The dopants may be introduced in-situ during growth and/or after growth by ion implantation.

Excess portions of the deposited semiconductor material can be removed from above the top surface of the insulating cap layer 70, for example, by chemical mechanical planarization (CMP) or a recess etch to form the drain regions 63 that is embedded within the first and second semiconductor material layers (512, 514). In one embodiment, a top surface of the drain region 63 can be coplanar with the top surface of the first and second semiconductor material layers (512, 514).

In one embodiment, the narrower band gap of the second compound semiconductor material than the first compound semiconductor material can provide a configuration in which the conduction band of the semiconductor channel (512, 514) has a minimum along a radial direction at, or in proximity to, the interface 520 between the first semiconductor material layer 512 and the second semiconductor material layer 514. The minimum in the conduction band can be a local minimum. In this case, electrons can be radially trapped at, or around, the local minimum of the conduction band. A two-dimensional electron gas 530 for electrical current conduction can be formed at, or in proximity to, the interface 520 between the first semiconductor material layer 512 and the second semiconductor material layer 514. The two-dimensional electron gas 530 for electrical current conduction can be formed within the second semiconductor material layer 514 and/or at the interface (or in the proximity to the interface) between the first and the second semiconductor material layers (512, 514).

The two-dimensional electron gas 530 can be located at the local minimum of the conduction band at, or in proximity to, the interface 520 between the first semiconductor material layer 512 and the second semiconductor material layer 514. The two-dimensional electron gas 530 can be a cylindrical confinement electron gas. As used herein, "cylindrical confinement" refers to a two-dimensional confinement in which a global topology of the two-dimensional space is homeomorphic to a sidewall surface of a cylinder. As used herein, "cylindrical confinement electron gas" refers to electron gas in cylindrical confinement. Electron current can flow vertically with high mobility in the cylindrical confinement electron gas. Thus, a quantum well is formed adjacent to the interface 520 in the heterostructure channel. Thus, quantum confinement (e.g., quantization) of electrons occurs in the channel.

In one embodiment, the two-dimensional electron gas 530 can be a conduction path for electrical current in a vertical NAND device employing the stack of the first and second semiconductor material layers (512, 514) as a semiconductor channel. A tunneling dielectric 506 is located on and embedded within charge storage elements 504, and laterally surrounds a portion of the semiconductor channel (512, 514). An adjoining set of a blocking dielectric 502, charge storage elements 504, and a tunneling dielectric 506 in a memory opening 49 collectively constitute a memory film 50, which can store electrical charges with a macroscopic retention time. As used herein, a macroscopic retention time refers to a retention time suitable for operation of a memory device as a permanent memory device such as a retention time in excess of 24 hours in one example.

FIGS. 3A and 3B illustrate sequential vertical cross-sectional views of a memory opening within the exemplary device structure during formation of a second exemplary memory stack structure according to a second embodiment of the present disclosure. The second exemplary memory stack structure of FIG. 3A can be derived from the first exemplary memory stack structure of FIG. 2I by implanting electrical dopants. The conductivity type of the electrical dopants can be the second conductivity type, i.e., the conductivity type that is the opposite of the first conductivity type. In one embodiment, the first conductivity type is p-type, the second conductivity type is n-type.

An upper portion of the first semiconductor material layer 512 is converted into a first annular drain extension region 532 by the implantation of the dopants of the second conductivity type. An upper portion of the second semiconductor material layer 514 is converted into a second annular drain extension region 534 by the implantation of the dopants of the second conductivity type. The second annular drain extension region 534 can have a greater height than the first annular drain extension region 532 and the recessed region. An upper portion of the outer periphery of the second annular drain extension region 534 contacts an inner periphery of the first annular drain extension region 532. A lower portion of the outer periphery of the second annular drain extension region 534 contact a surface of the first semiconductor material layer 512. In one embodiment, the atomic concentration of the dopants of the second conductivity type in the first and second annular drain extension regions (532, 534) can be in a range from $1.0 \times 10^{19}/cm^3$ to $2.0 \times 10^{21}/cm^3$, although lesser and greater atomic concentrations can also be employed.

Referring to FIG. 3B, the processing steps of FIGS. 2J and 2K can be performed to form the second exemplary memory stack structure. In one embodiment, an additional nickel containing layer 563 is formed between the doped III-V semiconductor region 534 (e.g., GaAs or InGaAs) and the silicon drain region 63 to form an improved contact between the III-V semiconductor channel and the silicon drain region 63. The nickel containing layer 563 may comprise a pure nickel metal layer, a nickel alloy, such as nickel-gold (e.g., 30 to 70 atomic % Ni, such as 50 at. % Ni) or nickel-gold-germanium alloy, or a nickel silicide if the nickel reacts with the silicon of the drain 63 after an anneal. The nickel containing layer 563 is formed in the recess in contact with region 534, followed by formation of the drain region 63 over layer 563. Thus, layer 563 is located between and in contact with region 534 and drain region 63. Layer 563 may also be used in the embodiments illustrated in FIGS. 2J, 2K, 4B and 5B.

Figure 8A:
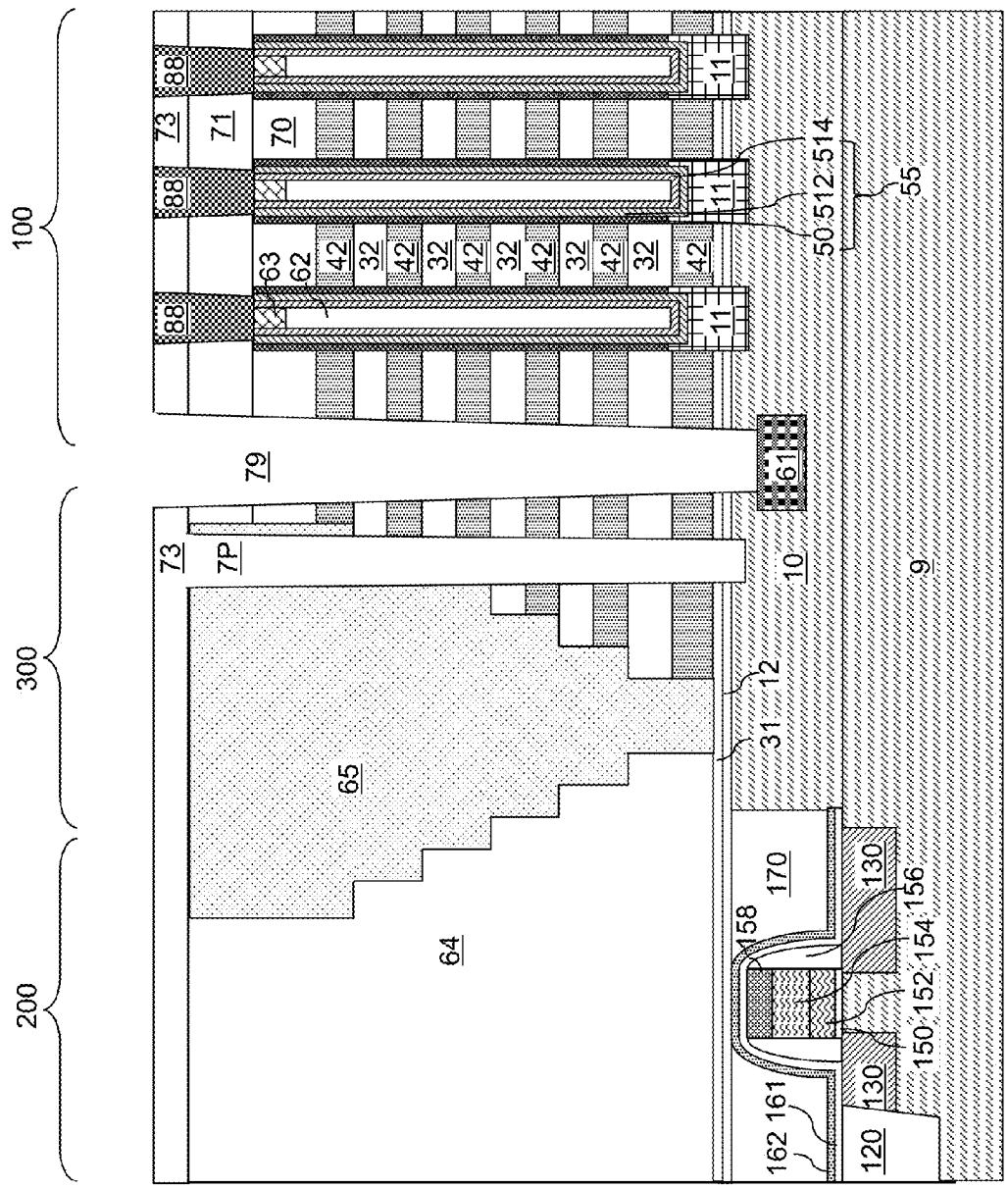
FIG. 8A is a vertical cross-sectional view of the exemplary device structure after formation of a backside contact trench according to an embodiment of the present disclosure.

In an alternative embodiment, the silicon drain region 63 may be replaced with a III-V compound semiconductor region. For example, the drain extension regions 532, 534 may be used as the drain region while omitting the silicon plug 63. Alternatively, instead of a doped silicon plug 63, a second conductivity type doped III-V compound semiconductor plug 63 may formed in contact with the region 534 to form a multi-part drain extension region. If desired, a metal or metal alloy may be formed in contact with the doped III-V compound semiconductor plug. The metal may be nickel, gold, zinc, germanium and alloys thereof, such as a nickel-gold alloy, a nickel-gold-germanium alloy or a zinc-gold alloy. The metal alloy may also be alloyed with the doped III-V compound semiconductor plug 63 to form a metal III-V semiconductor alloy region in contact with the drain extension region. The metal III-V semiconductor alloy may be located over the plug 63 such that it contacts a subsequently formed memory contact via structure (i.e., a drain contact via structure) 88, as shown in FIG. 8A.

Figures 4A, 4B:
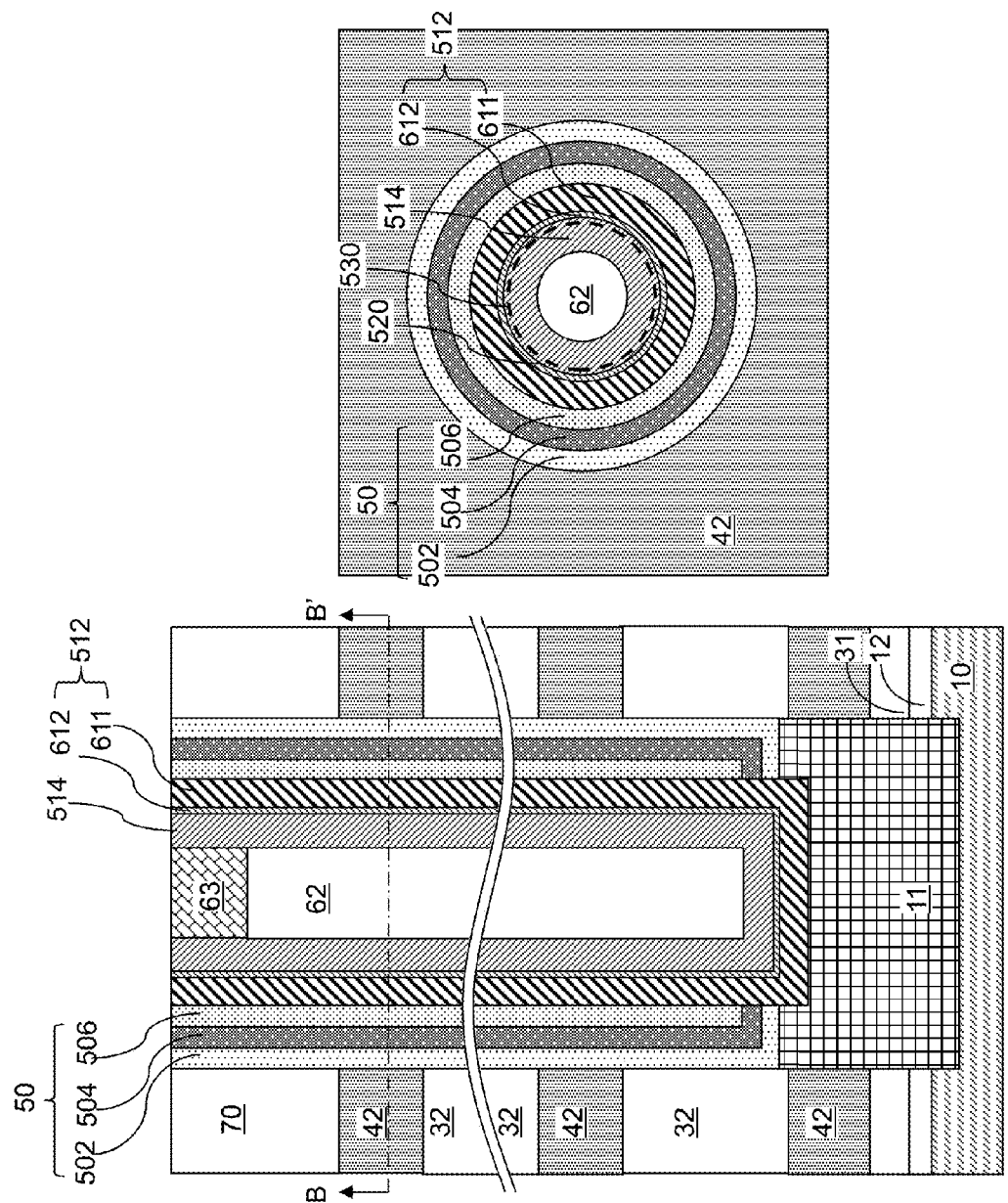
FIG. 4A is a vertical cross-sectional view of a memory opening including a third exemplary memory stack structure according to a third embodiment of the present disclosure.
FIG. 4B is a horizontal cross-sectional view of the third exemplary memory stack structure along the horizontal plane B-B' of FIG. 4A.

Referring to FIGS. 4A and 4B, a third exemplary memory stack structure according to a third embodiment of the present disclosure can be derived from the first or second exemplary memory stack structure by employing a stack of doped and undoped layers for the first semiconductor material layer 512. At the processing step of FIG. 2F, the first semiconductor material layer 512 is formed as a layer stack that includes an n-doped first compound semiconductor material layer 611, and an undoped first compound semiconductor material layer 612. The n-doped first compound semiconductor material layer 611 can be deposited first as an outer portion, and the undoped first compound semiconductor material layer 612 can be subsequently deposited as an inner portion. Preferably, layers 611 and 612 comprise the same material (e.g., doped and undoped AlGaAs, respectively) and layer 514 comprises a different material (e.g., undoped GaAs) with a narrower bandgap.

The n-doped first compound semiconductor material layer 611 and the undoped first compound semiconductor material layer 612 comprise a first compound semiconductor material, which can be the same (other than doping) as the first compound semiconductor material of the first embodiment. The n-doped first compound semiconductor material layer 611 has an n-type doping at a dopant concentration in a range from $1.0 \times 10^{16}/cm^3$ to $2.0 \times 10^{21}/cm^3$ (for example, in a range from $1.0 \times 10^{19}/cm^3$ to $2.0 \times 10^{20}/cm^3$), although lesser and greater dopant concentrations can also be employed. The undoped first compound semiconductor material layer 612 is undoped, i.e., has a dopant concentration less than $1.0 \times 10^{16}/cm^3$, although higher or lower doping levels may also be used. For III-V semiconductor materials, zinc may be used as a p-type dopant and silicon may be used as an n-type dopant.

The thickness of the n-doped first compound semiconductor material layer 611 can be in a range from 1 nm to 29 nm, such as 2 to 15 nm although lesser and greater thicknesses can also be employed. The thickness of the undoped first compound semiconductor material layer 612 can be in a range from 1 nm to 29 nm, such as 2 to 15 nm, although lesser and greater thicknesses can also be employed. The total thickness of layers 611 and 612 may be 4 to 30 nm, such as 8 to 15 nm. Subsequently, the processing steps of FIG. 2G and subsequent processing steps can be performed to provide the third exemplary memory stack structure illustrated in FIGS. 4A and 4B. The two-dimensional electron gas 530 can be formed at, or in proximity to, the interface 520 between the first semiconductor material layer 512 and the second semiconductor material layer 514, and within the second semiconductor material layer 514.

Referring to FIGS. 5A and 5B, a fourth exemplary memory stack structure according to a fourth embodiment of the present disclosure can be derived from the first or second exemplary memory stack structure by employing a stack of undoped and delta-doped layers for the first semiconductor material layer 512. At the processing step of FIG. 2F, the first semiconductor material layer 512 is formed as a layer stack that includes an undoped first compound semiconductor material layer 711, and an n-doped first compound semiconductor material layer 712. The undoped first compound semiconductor material layer 711 can be deposited first as an outer portion, and the n-doped first compound semiconductor material layer 712 can be subsequently deposited as an inner portion. Alternatively, the first semiconductor material layer 512 can be deposited as an undoped first compound semiconductor material layer 711, and an inner portion of the undoped first compound semiconductor material layer 711 can be converted into the n-doped first compound semiconductor material layer 712 by introducing a "delta doping" to the surfaces that are exposed to the cavity 49' or by in-situ growth of a doped layer 712. As used herein, a "delta doping" refers to a doping confined within less than three atomic layers, and can be performed by in-situ doping during growth, plasma doping or low energy ion implantation in which the energy of the implanted n-type dopants is so low that the implanted n-type dopants do not penetrate more than three atomic layers. For example, for in-situ delta doping, the delta doped portion of layer 712 may be grown at a higher temperature than the rest of the channel layers (e.g., 600 to 650° C.) using silane as a silicon doping source gas in addition to the III-V semiconductor source gases (e.g., TMA, TMG, arsine, etc.). Layers 711 and 712 preferably comprise the same material (e.g., undoped and delta doped AlGaAs) and layer 514 comprises a different material (e.g., undoped GaAs).

The undoped first compound semiconductor material layer 711 and the n-doped first compound semiconductor material layer 712 comprise a first compound semiconductor material, which can be the same (other than doping) as the first compound semiconductor material of the first embodiment. The n-doped first compound semiconductor material layer 711 has an n-type doping at a dopant concentration in a range from $1.0 \times 10^{16}/cm^3$ to $2.0 \times 10^{21}/cm^3$ (for example, in a range from $1.0 \times 10^{19}/cm^3$ to $2.0 \times 10^{21}/cm^3$), although lesser and greater dopant concentrations can also be employed. The undoped first compound semiconductor material layer 712 has a dopant concentration less than $1.0 \times 10^{16}/cm^3$ although higher or lower doping levels may also be used.

The thickness of the undoped first compound semiconductor material layer 711 can be in a range from 1 nm to 29 nm, such as 2 to 15 nm although lesser and greater thicknesses can also be employed. The thickness of the n-doped first compound semiconductor material layer 712 can be in a range from 1 nm to 29 nm, such as 2 to 15 nm although lesser and greater thicknesses can also be employed. The total thickness of layers 711 and 712 may be 4 to 30 nm, such as 8 to 15 nm. Subsequently, the processing steps of FIG. 2G and subsequent processing steps can be performed to provide the third exemplary memory stack structure illustrated in FIGS. 5A and 5B. The two-dimensional electron gas 530 can be formed at, or in proximity to, the interface 520 between the first semiconductor material layer 512 and the second semiconductor material layer 514, and within the second semiconductor material layer 514. In another embodiment, the delta-doped region (e.g. formed by in-situ "pulse doping") can be within the first semiconductor material layer 512, and can be surrounded by undoped regions of the first semiconductor material layer 512. In one embodiment, the innermost portion of the first semiconductor material layer 512 can be undoped.

Alternatively, an outer portion of the first compound semiconductor material can be undoped, an intermediate portion of the first compound semiconductor material can be n-type delta doped, an inner portion of the first compound semiconductor material can be undoped, and the second compound semiconductor material is undoped. In this case, the delta doping can be performed after depositing the semiconductor materials of the outer portion and the intermediate portion such that the intermediate portion is delta-doped. Subsequently, the inner portion of the first compound semiconductor material and the second compound semiconductor material can be sequentially deposited.

In general, any one or more of the outer portion of the first compound semiconductor material, the intermediate portion of the first compound semiconductor material, and the inner portion of the first compound semiconductor material can be doped, such as n-type doped, while the remaining portions can be undoped. In one embodiment, the n-type doping may be n-type delta doping. In another embodiment, the n-type doping may be non-delta doping.

Figure 6:
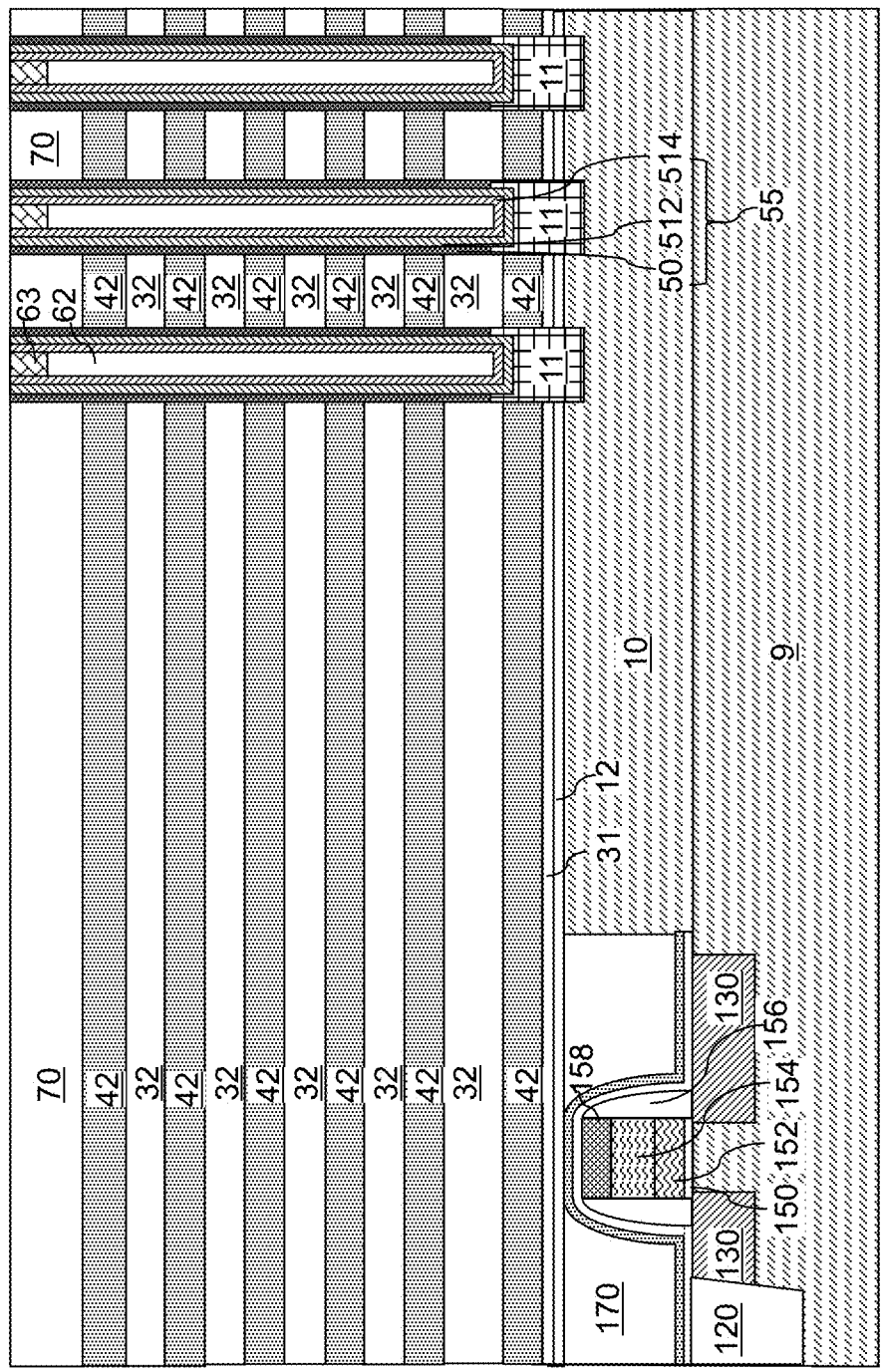
FIG. 6 is a vertical cross-sectional view of the exemplary device structure after formation of memory stack structures according to an embodiment of the present disclosure.

The exemplary memory stack structure can be embedded into the exemplary device structure illustrated in FIG. 1. FIG. 6 illustrates the exemplary device structure that incorporates multiple instances of the exemplary memory stack structure of FIGS. 2J and 2K, 3B, 4A and 4B, or 5A and 5B. The exemplary device structure includes a semiconductor device, which comprises a stack (32, 42) including an alternating plurality of material layers (e.g., the sacrificial material layers 42) and insulating layers 32 located over a semiconductor substrate (9, 10), and a memory opening extending through the stack (32, 42). The semiconductor device further comprises a blocking dielectric 502 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. The first and second semiconductor material layers (512, 514) collectively constitute a semiconductor channel (512, 514). A semiconductor channel (512, 514) and a memory film 50 in a same memory opening 49 constitute a memory stack structure 55.

Figure 7:
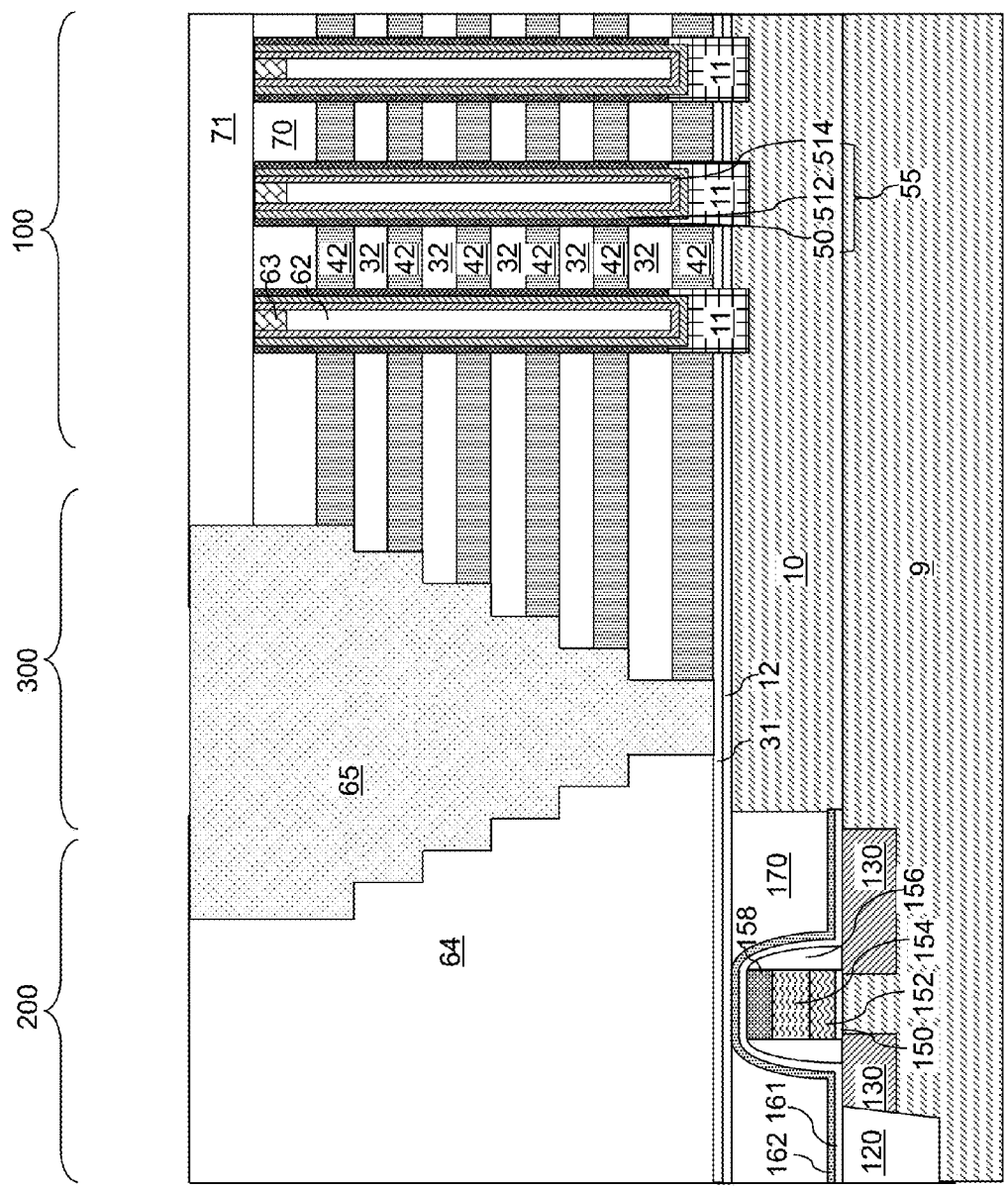
FIG. 7 is a vertical cross-sectional view of the exemplary device structure after formation of a stepped terrace and a retro-stepped dielectric material portion according to an embodiment of the present disclosure.

Referring to FIG. 7, an optional first array contact level dielectric layer 71 can be formed over the substrate (9, 10). As an optional structure, the first array contact level dielectric layer 71 may, or may not, be formed. In case the first array contact level dielectric layer 71 is formed, the first array contact level dielectric layer 71 includes a dielectric material such as silicon oxide, silicon nitride, silicon oxynitride, porous or non-porous organosilicate glass (OSG), or a combination thereof. If an organosilicate glass is employed, the organosilicate glass may, or may not, be doped with nitrogen. The first array contact level dielectric layer 71 can be formed over a horizontal plane including the top surface of the insulating cap layer 70 and the top surfaces of the drain regions 63. The first array contact level dielectric layer 71 can be deposited by chemical vapor deposition, atomic layer deposition (ALD), spin-coating, or a combination thereof. The thickness of the first array contact level dielectric layer 71 can be in a range from 10 nm to 300 nm, although lesser and greater thicknesses can also be employed.

In one embodiment, the first array contact level dielectric layer 71 can be formed as a dielectric material layer having a uniform thickness throughout. The first array contact level dielectric layer 71 may be formed as a single dielectric material layer, or can be formed as a stack of a plurality of dielectric material layers. Alternatively, formation of the first array contact level dielectric layer 71 may be merged with formation of at least one line level dielectric layer (not shown). While the present disclosure is described employing an embodiment in which the first array contact level dielectric layer 71 is a structure separate from an optional second array contact level dielectric layer or at least one line level dielectric layer to be subsequently deposited, embodiments in which the first array contact level dielectric layer 71 and at least one line level dielectric layer are formed at a same processing step, and/or as a same material layer, are expressly contemplated herein.

Optionally, a portion of the alternating stack (32, 42) can be removed, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed within an area that includes a peripheral device region 200 and a portion of a contact region 300, which is adjacent to a device region 100 that includes an array of memory stack structures 55. Subsequently, the trench can be filled with an optional dielectric material such as silicon oxide. Excess portions of the dielectric material can be removed from above the top surface of the first array contact level dielectric layer 71 by a planarization process such as chemical mechanical planarization and/or a recess etch. The top surfaces of the first array contact level dielectric layer 71 can be employed as a stopping surface during the planarization. The remaining dielectric material in the trench constitutes a dielectric material portion 64.

A stepped cavity can be formed within the contact region 300, which can straddle the dielectric material portion 64 and a portion of the alternating stack (32, 42). Alternatively, the dielectric material portion 64 may be omitted and the stepped cavity 69 may be formed directly in the stack (32, 42). The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

The dielectric material portion 64 can have stepped surfaces after formation of the stepped cavity, and a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the first array contact level dielectric layer 71, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Referring to FIGS. 8A and 8B, at least one dielectric support pillar 7P may be optionally formed through the retro-stepped dielectric material portion 65 and/or through the first array contact level dielectric layer 71 and/or through the alternating stack (32, 42). The plane A-A' in FIG. 8B corresponds to the plane of the vertical cross-sectional view of FIG. 8A. In one embodiment, the at least one dielectric support pillar 7P can be formed in the contact region 300, which is located adjacent to the device region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the sacrificial material layers 42.

In one embodiment, the at least one dielectric support pillar can include silicon oxide and/or a dielectric metal oxide such as aluminum oxide. In one embodiment, the portion of the dielectric material that is deposited over the first array contact level dielectric layer 71 concurrently with deposition of the at least one dielectric support pillar 7P can be present over the first array contact level dielectric layer 71 as a second array contact level dielectric layer 73. Each of the at least one dielectric support pillar 7P and the second array contact level dielectric layer 73 is an optional structure. As such, the second array contact level dielectric layer 73 may, or may not, be present over the insulating cap layer 70 and the retro-stepped dielectric material portion 65. The first array contact level dielectric layer 71 and the second array contact level dielectric layer 73 are herein collectively referred to as at least one array contact level dielectric layer (71, 73). In one embodiment, the at least one array contact level dielectric layer (71, 73) can include both the first and second array contact level dielectric layers (71, 73), and optionally include any additional via level dielectric layer that can be subsequently formed. In another embodiment, the at least one array contact level dielectric layer (71, 73) can include only the first array contact level dielectric layer 71 or the second array contact level dielectric layer 73, and optionally include any additional via level dielectric layer that can be subsequently formed. Alternatively, formation of the first and second array contact level dielectric layers (71, 73) may be omitted, and at least one via level dielectric layer may be subsequently formed, i.e., after formation of a backside contact via structure.

The second array contact level dielectric layer 73 and the at least one dielectric support pillar 7P can be formed as a single contiguous structure of integral construction, i.e., without any material interface therebetween. In another embodiment, the portion of the dielectric material that is deposited over the first array contact level dielectric layer 71 concurrently with deposition of the at least one dielectric support pillar 7P can be removed, for example, by chemical mechanical planarization or a recess etch. In this case, the second array contact level dielectric layer 73 is not present, and the top surface of the first array contact level dielectric layer 71 can be physically exposed.

Memory contact via structures 88 can be formed through the first and second array contact level dielectric layers (73, 71). Specifically, a photoresist layer can be applied over the second array contact level dielectric layer 73, and can be lithographically patterned to form openings overlying the drain structures 63. An anisotropic etch can be performed to transfer the pattern in the photoresist layer through the first and second array contact level dielectric layers (73, 71) to form memory contact via cavities that extend through the first and second array contact level dielectric layers (73, 71). The memory contact via cavities can be filled with at least one conductive material. Excess portions of the at least one conductive material can be removed from above a horizontal plane including a top surface of the second array contact level dielectric layer 73. Each remaining contiguous portion of the at least one conductive material constitutes a memory contact via structure 88, which contacts a top surface of an underlying drain region 63. The photoresist layer can be subsequently removed, for example, by ashing. Alternatively, structures 88 may be formed at a later step shown in FIG. 12.

Another photoresist layer (not shown) can be applied over the alternating stack (32, 42) and/or the retro-stepped dielectric material portion 65, and optionally over the and lithographically patterned to form at least one backside contact trench 79 in an area in which formation of a backside contact via structure is desired. The pattern in the photoresist layer can be transferred through the alternating stack (32, 42) and/or the retro-stepped dielectric material portion 65 employing an anisotropic etch to form the at least one backside contact trench 79, which extends at least to the top surface of the substrate (9, 10). In one embodiment, the at least one backside contact trench 79 can include a source contact opening in which a source contact via structure can be subsequently formed. A source region 61 can be formed by implanting electrical dopants through each backside contact trench into a semiconductor portion located on, or within, the substrate (9, 10). For example, a source region 61 may be formed by implantation of dopant atoms into a portion of the semiconductor material layer 10 through each backside contact trench 79. Alternatively, a semiconductor portion can be formed on the substrate (9, 10) by deposition of a semiconductor material, for example, by selective epitaxy, and by implantation of electrical dopants into the deposited semiconductor portion.

Figure 9:
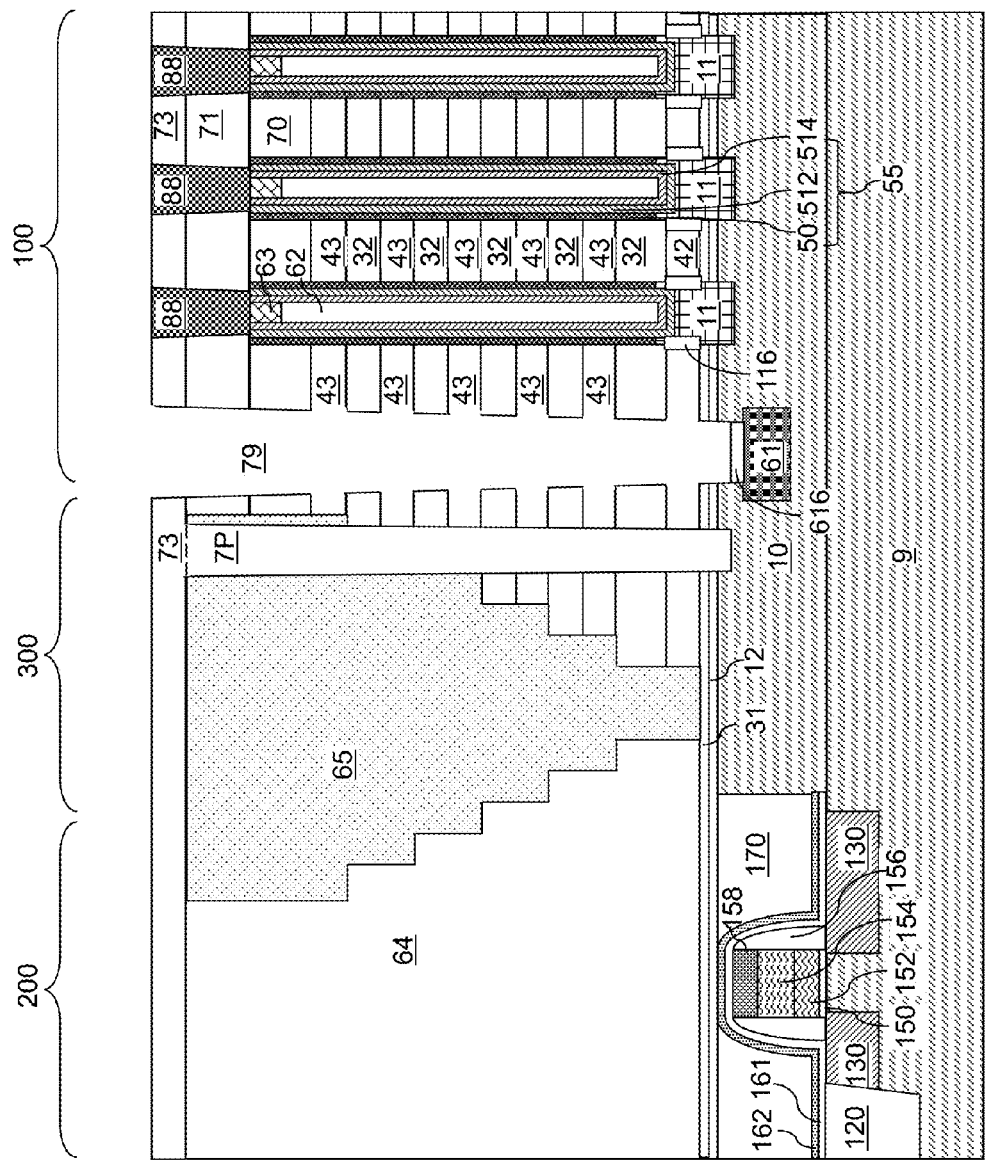
FIG. 9 is a vertical cross-sectional view of the exemplary device structure after formation of backside recesses according to the embodiment of the present disclosure.

Referring to FIG. 9, an etchant that selectively etches the second material of the sacrificial material layers 42 with respect to the first material of the insulating layers 32 can be introduced into the at least one backside trench 79, for example, employing an etch process. Backside recesses 43 are formed in volumes from which the sacrificial material layers 42 are removed. The removal of the second material of the sacrificial material layers 42 can be selective to the first material of the insulating layers 32, the material of the at least one dielectric support pillar 7P, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the at least one dielectric support pillar 7P, and the retro-stepped dielectric material portion 65 can be selected from silicon oxide, silicon nitride, and dielectric metal oxides. In this case, the depth of the at least one backside trench 79 can be modified so that the bottommost surface of the at least one backside trench 79 is located within the dielectric pad layer 12, i.e., to avoid physical exposure of the top surface of the semiconductor substrate layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the memory device region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout. Optionally, a backside blocking dielectric layer can be formed in the backside recesses.

Figure 10:
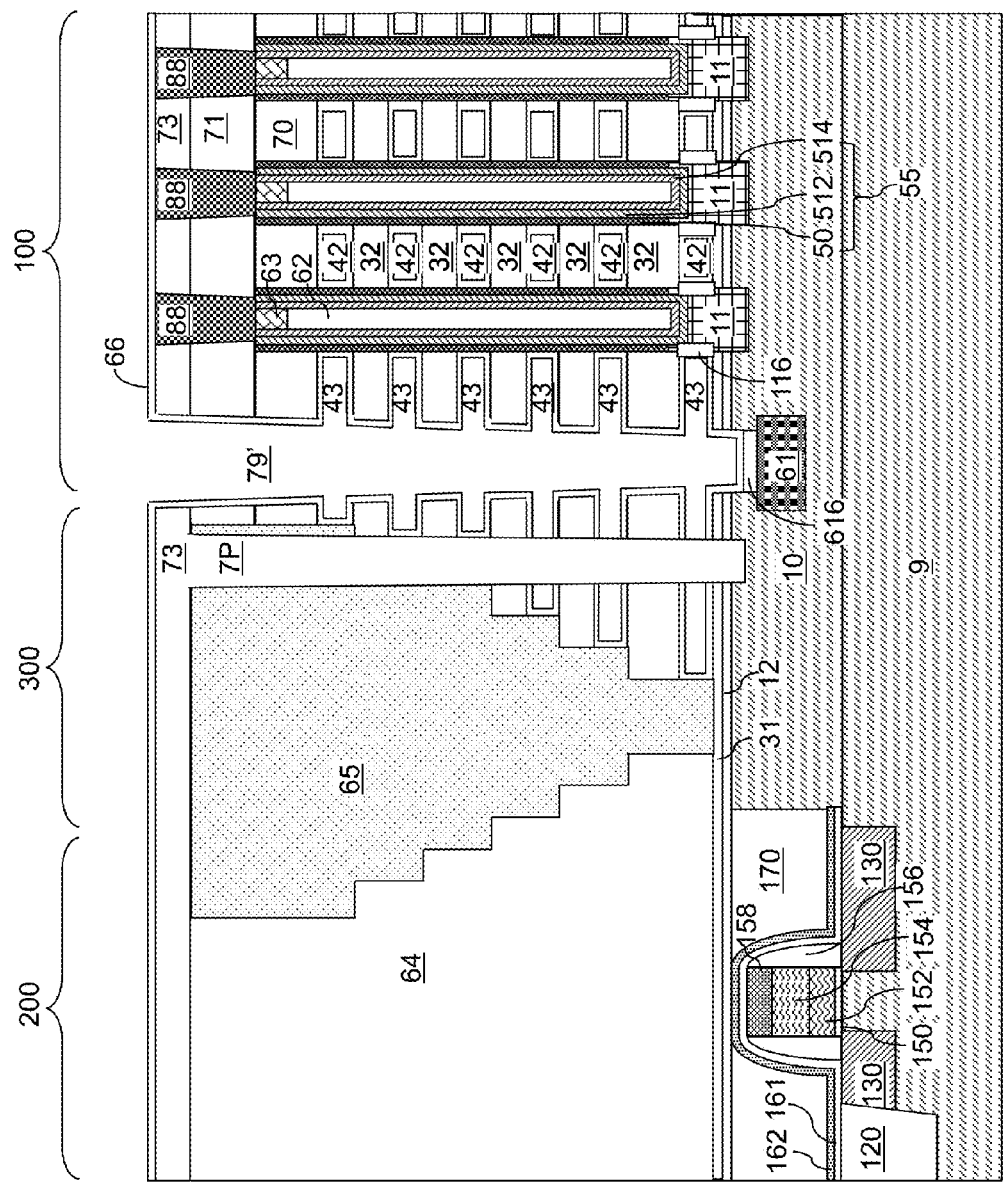
FIG. 10 is a vertical cross-sectional view of the exemplary device structure after formation of a backside blocking dielectric layer according to an embodiment of the present disclosure.

Referring to FIG. 10, a backside blocking dielectric layer 66 can be optionally formed. The backside blocking dielectric layer 66 comprises a dielectric material that functions as a control gate dielectric for the control gates to be subsequently formed in the backside recesses 43. In case the blocking dielectric 502 is present within each memory opening, the backside blocking dielectric layer 66 is optional. In case the blocking dielectric 502 is omitted, the backside blocking dielectric layer 66 is present.

The dielectric material of the backside blocking dielectric layer 66 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 66 can include a silicon oxide layer. The backside blocking dielectric layer 66 can be deposited by a conformal deposition method such as chemical vapor deposition or atomic layer deposition. The thickness of the backside blocking dielectric layer 66 can be in a range from 1 nm to 10 nm, although lesser and greater thicknesses can also be employed. The backside blocking dielectric layer 66 is formed on the sidewalls of the at least one backside via trench 79, horizontal surfaces and sidewalls of the insulating layers 32, the portions of the sidewall surfaces of the memory stack structures 55 that are physically exposed to the backside recesses 43, and a top surface of a source region 61 (if formed prior to formation of the backside blocking dielectric layer 66). A backside cavity 79' is present within the portion of each backside via trench 79 that is not filled with the backside blocking dielectric layer 66.

Figure 11:
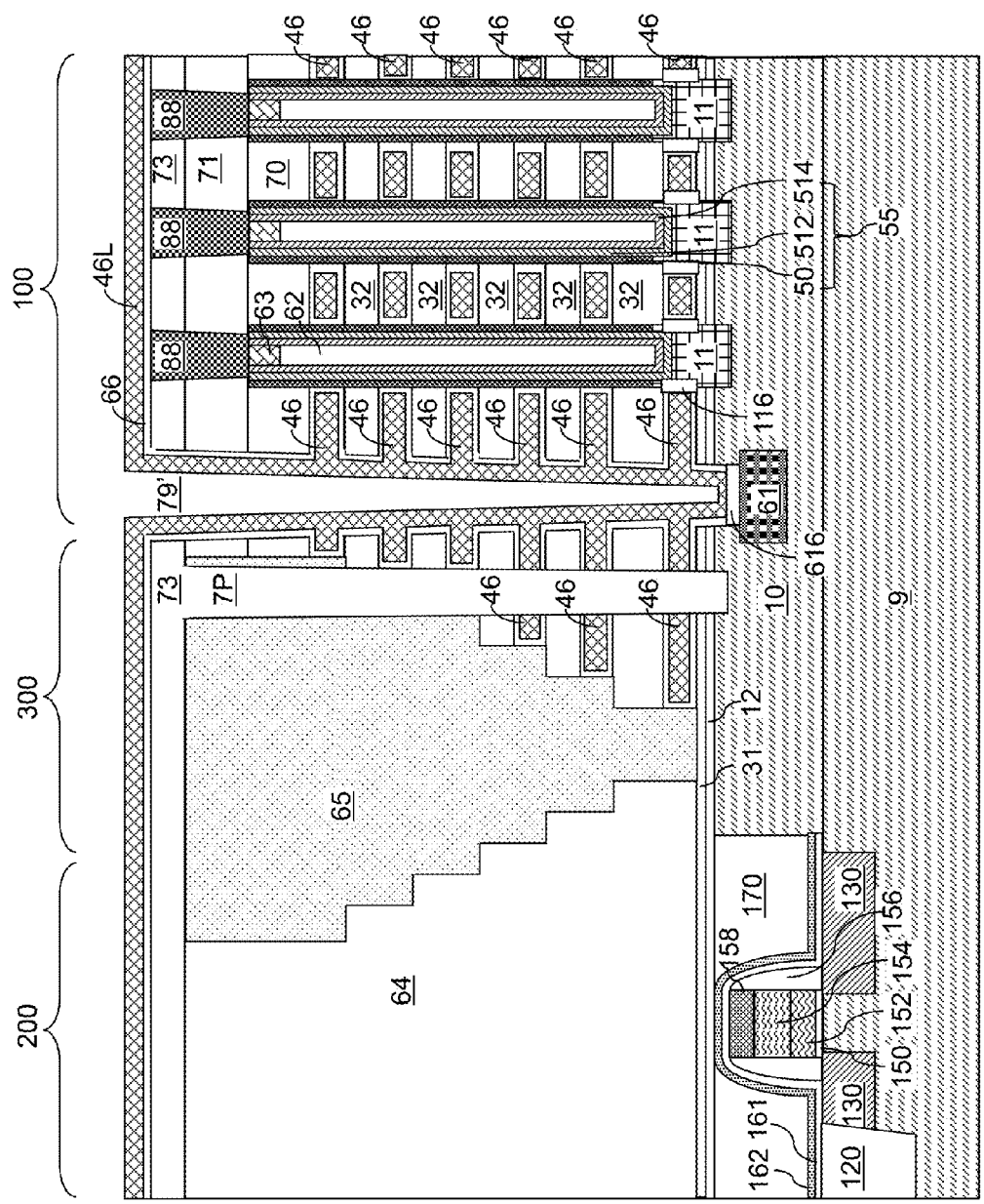
FIG. 11 is a vertical cross-sectional view of the exemplary device structure after formation of electrically conductive layers according to an embodiment of the present disclosure.

Referring to FIG. 11, at least one metallic material can be deposited in the plurality of backside recesses 43, on the sidewalls of the at least one the backside contact trench 79, and over the top surface of the second contact level dielectric layer 73. As used herein, a metallic material refers to an electrically conductive material that includes at least one metallic element.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses 43 can be a combination of titanium nitride layer and a tungsten fill material. In one embodiment, the metallic material can be deposited by chemical vapor deposition.

A plurality of electrically conductive layers 46 can be formed in the plurality of backside recesses 43, and a contiguous metallic material layer 46L can be formed on the sidewalls of each backside contact trench 79 and over the at least one contact level dielectric layer (71,73). Thus, each sacrificial material layer 42 can be replaced with an electrically conductive layer 46. A backside cavity 79' is present in the portion of each backside contact trench 79 that is not filled with the backside blocking dielectric layer 66 and the contiguous metallic material layer 46L. A dielectric spacer 116 laterally surrounds a semiconductor portion that underlies the lower doped semiconductor portion, wherein one of the electrically conductive layers laterally surrounds the dielectric spacer upon formation of the electrically conductive layers.

Figure 12:
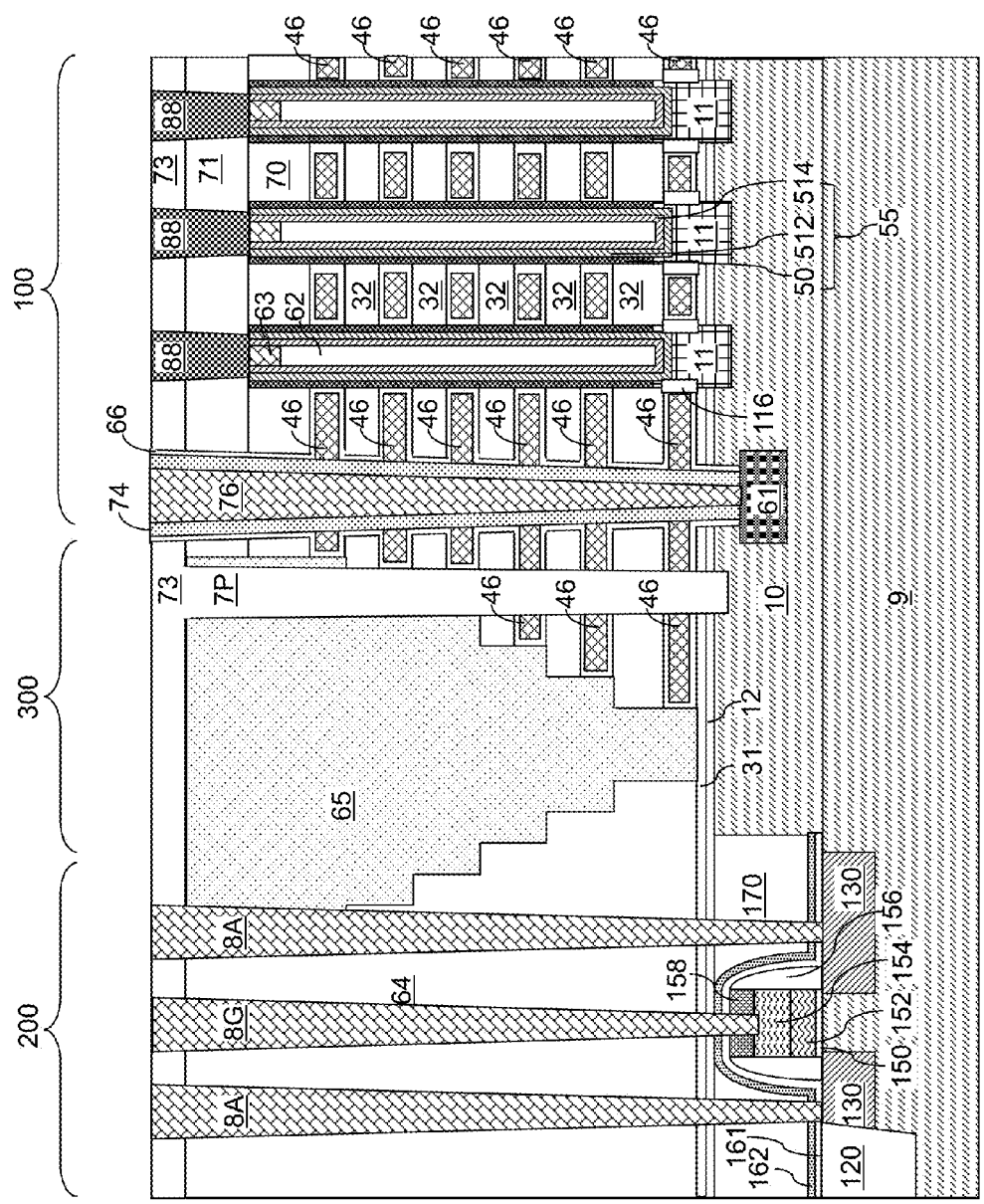
FIG. 12 is a vertical cross-sectional view of the exemplary device structure after formation of contact via structures according to an embodiment of the present disclosure.

Referring to FIG. 12, the deposited metallic materials of the contiguous electrically conductive material layer 46L is etched back from the sidewalls of each backside contact trench 79 and from above the second contact level dielectric layer 73 (or the dielectric material layer underlying the topmost horizontal portion of the contiguous electrically conductive material layer 46L in case the second contact level dielectric layer 73 is not present), for example, by an isotropic etch. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

An insulating material layer 74 can be formed in the at least one backside contact trench 79 and over the second contact level dielectric layer 73 by a conformal deposition process. Exemplary conformal deposition processes include, but are not limited to, chemical vapor deposition and atomic layer deposition. The insulating material layer 74 includes an insulating material such as silicon oxide, silicon nitride, a dielectric metal oxide, an organosilicate glass, or a combination thereof. The thickness of the insulating material layer 74 can be in a range from 1.5 nm to 60 nm, although lesser and greater thicknesses can also be employed.

An anisotropic etch is performed to remove horizontal portions of the insulating material layer 74 and to remove the horizontal portion of the backside blocking dielectric layer 66 from above the second contact level dielectric layer 73 and from the bottom of the trench. Each remaining portion of the insulating material layer inside a backside contact trench 79 constitutes a vertically elongated annular structure with a vertical cavity therethrough, which is herein referred to as an insulating spacer 74. In one embodiment, an annular bottom surface of the insulating spacer 74 contacts a top surface of the source region 61 (i.e., the bottom edge of spacer 74 contacts a peripheral portion of the source region 61), while a center portion of the top surface of the source region 61 is physically exposed.

Each insulating spacer 74 can be formed over the sidewalls of the backside contact trench 79, and can be formed directly on substantially vertical sidewalls of the backside blocking dielectric layer 66 and directly on the sidewalls of the electrically conductive layers 46, i.e., directly on the sidewalls of the metallic material portions 46. The thickness of each insulating spacer 74, as measured at a bottom portion thereof, can be in a range from 1.5 nm to 60 nm, although lesser and greater thicknesses can also be employed. In one embodiment, the thickness of the insulating spacer 74 can be in a range from 3 nm to 10 nm.

A backside contact via structure 76 can be formed in the cavity surrounded by the insulating spacer 74. The backside contact via structure 76 includes a conductive material, which can include, for example, a conductive liner (such as a Ti barrier layer and/or a TiN barrier layer) and a conductive fill material such as tungsten. The backside contact via structure 76 can function as a source line that contacts the source region 61.

Various contact via structures can be formed through dielectric material layers/portions of the exemplary structure. For example, peripheral device contact via structures (8G, 8A) can be formed in the peripheral device region to provide electrical contact to various nodes of the peripheral devices. The peripheral device contact via structures (8G, 8A) can include, for example, at least one gate contact via structure 8G and at least one active region contact via structure 8A. If desired, the memory contact via structures 88 and/or word line contact via structures to word lines/control gates 46 may also be formed during the same step as structures 8G, 8A.

The exemplary structure includes a monolithic three-dimensional memory device. The monolithic three-dimensional memory device comprises a stack of alternating layers comprising insulating layers 32 and electrically conductive layers 46 and located over a substrate (9, 10); a memory opening 49 vertically extending through the stack of alternating layers; a memory film 50 located at a periphery of the memory opening 49; a first semiconductor material layer 512 having a first band gap and located inside the memory film 50; and a second semiconductor material layer 514 having a second band gap that is less than the first band gap and located inside the first semiconductor material layer 512. A two-dimensional electron gas 530 for electrical current conduction is present at, or in proximity to, an interface 520 between the first semiconductor material layer 512 and the second semiconductor material layer 514.

In one embodiment, the memory device of the present disclosure can be a monolithic three-dimensional memory device comprising a vertical NAND device located over the substrate (9, 10), and the electrically conductive layers 46 can comprise, or are electrically connected to, a respective word line of the vertical NAND device. The substrate (9, 10) can comprise a silicon substrate. The vertical NAND device can comprise an array of monolithic three-dimensional NAND strings located over the silicon substrate. At least one memory cell in a first device level of the three-dimensional array of NAND strings is located over another memory cell in a second device level of the three-dimensional array of NAND string. The silicon substrate can contain an integrated circuit comprising a driver circuit for the memory device located thereon.

The array of monolithic three-dimensional NAND strings can comprise a plurality of semiconductor channels. At least one end portion of each of the plurality of semiconductor channels extends substantially perpendicular to a top surface of the substrate (9, 10). In one embodiment, the plurality of semiconductor channels can comprise a common horizontal semiconductor channel portion that is a portion of the semiconductor material layer 10 between a source region 61 and the epitaxial channel portions 11, the epitaxial channel portions 11, and the vertical semiconductor channels 60 that are portions of the memory stack structures 55. The array of monolithic three-dimensional NAND strings can comprise a plurality of charge storage elements (which can be embodied as sections of a memory material layer 504 that is present within each memory stack structure 55). Each charge storage element can be located adjacent to a respective one of the plurality of semiconductor channels, i.e., adjacent to a respective vertical semiconductor channel 60. The array of monolithic three-dimensional NAND strings can comprise a plurality of control gate electrodes having a strip shape extending substantially parallel to the top surface of the substrate (9, 10). The plurality of control gate electrodes comprise at least a first control gate electrode located in the first device level and a second control gate electrode located in the second device level.

Figure 13:
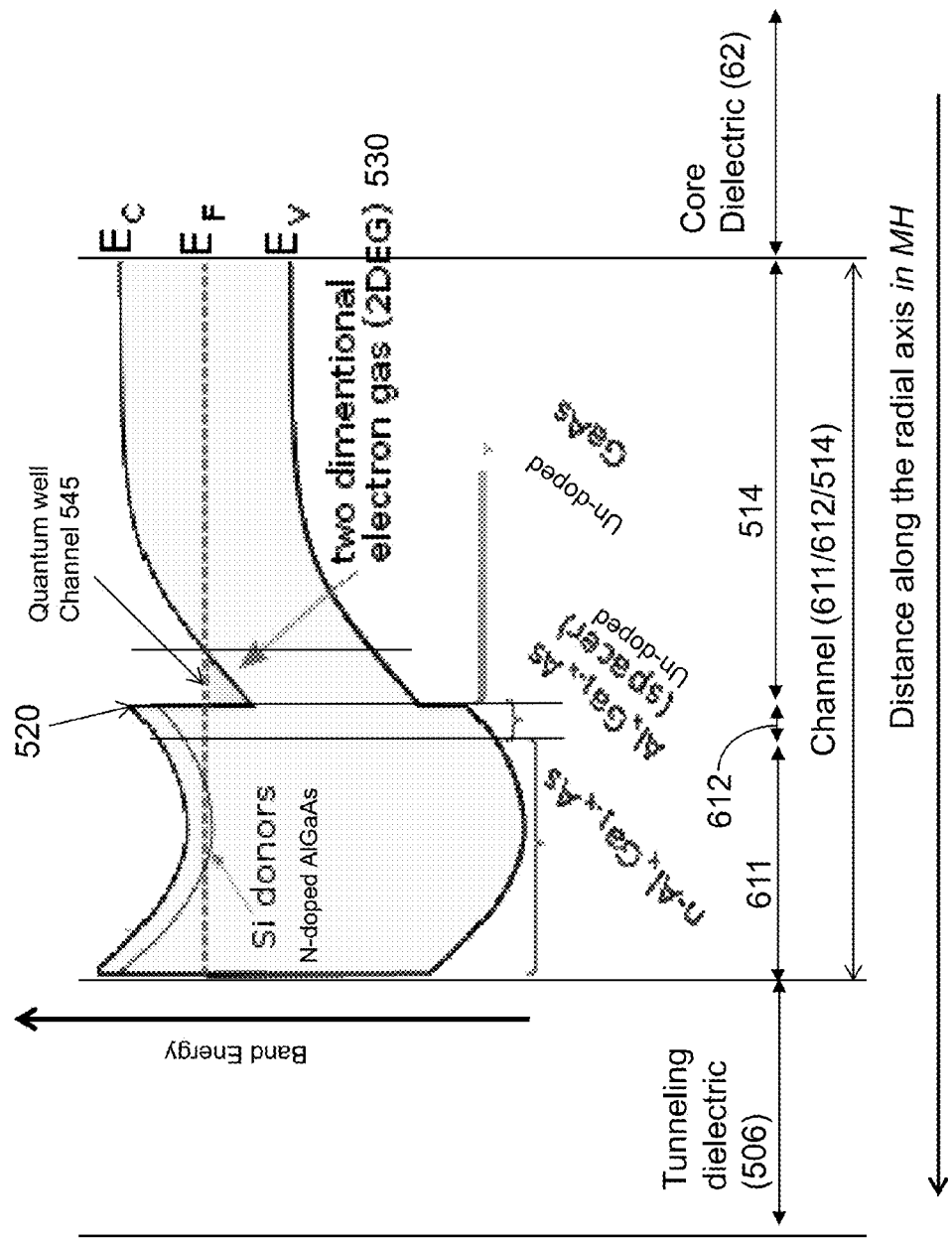
FIG. 13 is a band diagram along a radial direction of an exemplary semiconductor channel according to an embodiment of the present disclosure.

Referring to FIG. 13, a band diagram of the semiconductor channel of the third exemplary structure of the present disclosure is illustrated. The horizontal axis represents the distance along the radial axis in a memory opening (e.g., memory hole) 49. The vertical axis represents the band energy. The n-doped first semiconductor material layer 611 can include n-doped aluminum gallium arsenide, and the undoped first semiconductor material layer 612 can include undoped aluminum gallium arsenide. The second semiconductor material layer 514 can comprise undoped gallium arsenide. A quantum well 540 that confines a two-dimensional electron gas 430 is formed in proximity to the interface 520 between the undoped first semiconductor material layer 612 and the second semiconductor material layer 514 due to the band gap discontinuity at the interface. The two-dimensional electron gas 530 in the quantum well 540 can provide high mobility transport of elections due to the two-dimensional quantum well confinement of the electrons.

The devices of the present disclosure can thus provide high mobility charge carrier transport by employing a two-dimensional quantum well within a semiconductor channel in a vertical memory device. The high mobility transport of electrons can be advantageously employed to increase the on-current of a memory stack structure, and to increase the signal-to-noise ratio during the read operation of the memory stack structure.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a monolithic three-dimensional memory device, comprising:
    forming a stack of alternating layers comprising first material layers and second material layers over a substrate;
    forming a memory opening through the stack of alternating layers;
    forming a memory film in the memory opening;
    forming a first semiconductor material layer having a first band gap over the memory film; and
    forming a second semiconductor material layer having a second band gap that is narrower than the first band gap over the first semiconductor material layer, wherein a heterostructure quantum well is formed at an interface between the first semiconductor material layer and the second semiconductor material layer,
    wherein:
    the first semiconductor material layer comprises a first III-V compound semiconductor material; and
    the second semiconductor material layer comprises a second III-V compound semiconductor material.

2. The method of claim 1, wherein:
    the first III-V compound semiconductor material is undoped; and
    the second III-V compound semiconductor material is undoped.

3. The method of claim 1, wherein:
    the first semiconductor material layer is formed by depositing an n-doped first compound semiconductor material layer as an outer portion and subsequently depositing an undoped first compound semiconductor material layer as an inner portion; and
    the second semiconductor material layer is formed by depositing an undoped second compound semiconductor material layer.

4. The method of claim 1, wherein:
    the first semiconductor material layer is formed by depositing an undoped first compound semiconductor material layer as an outer portion and subsequently forming an n-type delta doped first compound semiconductor material layer as an inner portion; and
    the second semiconductor material layer is formed by depositing an undoped second compound semiconductor material layer.

5. The method of claim 1, wherein:
    the first semiconductor material layer is formed by depositing an undoped first compound semiconductor material layer as an outer portion, forming an n-type delta doped first compound semiconductor material layer as an intermediate portion, and depositing an additional first compound semiconductor material layer as an inner portion of the first semiconductor material layer; and
    the second semiconductor material layer is formed by depositing an undoped second compound semiconductor material layer.

6. The method of claim 1, wherein the first and second III-V compound semiconductor materials comprise single crystalline or large grain polycrystalline materials having an average grain size greater than 300 nm along at least one direction.

7. The method of claim 6, wherein:
    the first semiconductor material layer is deposited over a Group III nucleation layer;
    the first semiconductor material layer is deposited at a higher temperature than the second semiconductor material layer; and
    respective first and second self annealing steps are performed after the respective first and second semiconductor material layers are deposited.

8. The method of claim 1, wherein:
    the first III-V compound semiconductor material comprises a material selected from AlGaAs, GaAs, InAlAs, and InGaAlAs; and
    the second III-V compound semiconductor material comprises a material selected from GaAs, InGaAs, InP, InAs, and InGaAsP.

9. A method of forming a monolithic three-dimensional memory device, comprising:
    forming a stack of alternating layers comprising first material layers and second material layers over a substrate;
    forming a memory opening through the stack of alternating layers;
    forming a memory film in the memory opening;
    forming an epitaxial single crystal pedestal at a bottom portion of the memory opening, wherein the memory film is formed over, and on, the epitaxial single crystal pedestal;
    forming a first semiconductor material layer having a first band gap over the memory film; and
    forming a second semiconductor material layer having a second band gap that is narrower than the first band gap over the first semiconductor material layer, wherein a heterostructure quantum well is formed at an interface between the first semiconductor material layer and the second semiconductor material layer, wherein each of the first semiconductor material layer and the second semiconductor material layer is formed as a single crystalline or polycrystalline III-V compound semiconductor material layer.

10. The method of claim 9, wherein a single crystal material of the epitaxial single crystal pedestal is different in composition from III-V compound semiconductor materials of the first and second semiconductor material layers.

11. The method of claim 10, wherein the single crystal material of the epitaxial single crystal pedestal comprises single crystalline silicon.

12. The method of claim 9, wherein a single crystal material of the epitaxial single crystal pedestal comprises a III-V semiconductor material that is the same in composition as a III-V compound semiconductor material within one of the first and the second semiconductor material layers.

13. A method of forming a monolithic three-dimensional memory device, comprising:
    forming a stack of alternating layers comprising first material layers and second material layers over a substrate;
    forming a memory opening through the stack of alternating layers;
    forming a memory film in the memory opening;
    forming a first semiconductor material layer having a first band gap over the memory film;
    forming a second semiconductor material layer having a second band gap that is narrower than the first band gap over the first semiconductor material layer, wherein a heterostructure quantum well is formed at an interface between the first semiconductor material layer and the second semiconductor material layer;
    forming a drain region at an upper portion of the second semiconductor material layer;
    forming a source region located in the substrate and laterally spaced from the memory opening;
    forming a backside contact trench through the stack of alternating layers; and
    forming backside recesses by removing the second material layers selective to the first material layers employing an etchant introduced into the backside contact trench; and
    forming electrically conductive layers in the backside recesses, wherein the first material layers are insulator layers, and an alternating stack of the insulator layers and the electrically conductive layers is formed;
    forming an insulating spacer in the backside contact trench after formation of the alternating stack; and
    forming a contact via structure within a cavity inside the insulating spacer.

14. The method of claim 13, wherein forming the drain region comprises doping an upper part of the second semiconductor material layer to form a doped III-V compound semiconductor material drain extension region contacting an upper part of the second semiconductor material layer, forming a nickel containing material layer over the drain extension region, and forming a doped silicon region over the nickel containing material layer.

15. The method of claim 13, wherein forming the drain region comprises doping an upper part of the second semiconductor material layer to form a doped III-V compound semiconductor material drain extension region contacting an upper part of the second semiconductor material layer, and forming a metal III-V semiconductor alloy region in contact with the drain extension region, and further comprising forming a drain contact via structure which contacts the metal III-V semiconductor alloy-region.

16. The method of claim 15, wherein the metal III-V semiconductor alloy region comprises an alloy of a III-V semiconductor material with at least one of nickel, gold, zinc, germanium and alloys thereof.

17. The method of claim 13, wherein:
    the monolithic three-dimensional memory device comprises a vertical NAND device located over the substrate;
    the electrically conductive layers comprise, or are electrically connected to, a respective word line of the vertical NAND device;
    the substrate comprises a silicon substrate;
    the vertical NAND device comprises an array of monolithic three-dimensional NAND strings located over the silicon substrate;
    at least one memory cell in a first device level of the array of monolithic three-dimensional NAND strings is located over another memory cell in a second device level of the array of monolithic three-dimensional NAND strings;
    the silicon substrate contains an integrated circuit comprising a driver circuit for the memory device located thereon; and
    the array of monolithic three-dimensional NAND strings comprises:
        a plurality of semiconductor channels, wherein at least one end portion of each of the plurality of semiconductor channels extends substantially perpendicular to a top surface of the substrate;
        a plurality of charge storage elements, each of the charge storage elements being located adjacent to a respective one of the plurality of semiconductor channels; and
        a plurality of control gate electrodes having a strip shape extending substantially parallel to the top surface of the substrate, the plurality of control gate electrodes comprise at least a first control gate electrode located in the first device level and a second control gate electrode located in the second device level.

* * * * *